(12) United States Patent
Ono et al.

(10) Patent No.: US 7,932,562 B2
(45) Date of Patent: Apr. 26, 2011

(54) GATE PROTECTION DIODE FOR HIGH-FREQUENCY POWER AMPLIFIER

(75) Inventors: Hideyuki Ono, Tokyo (JP); Tetsuya Iida, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 189 days.

(21) Appl. No.: 12/251,790

(22) Filed: Oct. 15, 2008

(65) Prior Publication Data

US 2009/0159974 A1 Jun. 25, 2009

(30) Foreign Application Priority Data

Dec. 25, 2007 (JP) ................................. 2007-331473

(51) Int. Cl.
 *H01L 27/06* (2006.01)
(52) U.S. Cl. ................................. 257/362; 257/E27.016
(58) Field of Classification Search .................. 257/339, 257/341, 362, 376, E27.016, E49.001
See application file for complete search history.

(56) References Cited

U.S. PATENT DOCUMENTS

| 6,346,728 B1 * | 2/2002 | Inoue et al. .................... 257/341 |
| 6,933,559 B1 | 8/2005 | Van Roijen et al. |
| 2007/0114606 A1 | 5/2007 | Hoshino et al. |

FOREIGN PATENT DOCUMENTS

| JP | 2001-094094 | 4/2001 |
| JP | 2003-509867 | 3/2003 |

* cited by examiner

*Primary Examiner* — Evan Pert
*Assistant Examiner* — Selim Ahmed
(74) *Attorney, Agent, or Firm* — Mattingly & Malur, P.C.

(57) ABSTRACT

A high-frequency power amplifier of the type to be mounted in an RF module for mobile phones having high-frequency power field effect transistors and gate protective diodes which are coupled between the gates and the sources of the high-frequency power field effect transistors. The gate protective diodes have an n type region formed over the main surface of a p type epitaxial layer, a first p type region formed at the center of the main surface of the n type region, a second p type region formed over the main surface of the epitaxial layer around the n type region from the periphery of the main surface of the n type region, and p⁺ type buried layers for coupling the second p type region to a substrate body. The distance between the end portions of the p⁺ type buried layers and the n⁺ type region is 7 μm or more.

11 Claims, 22 Drawing Sheets

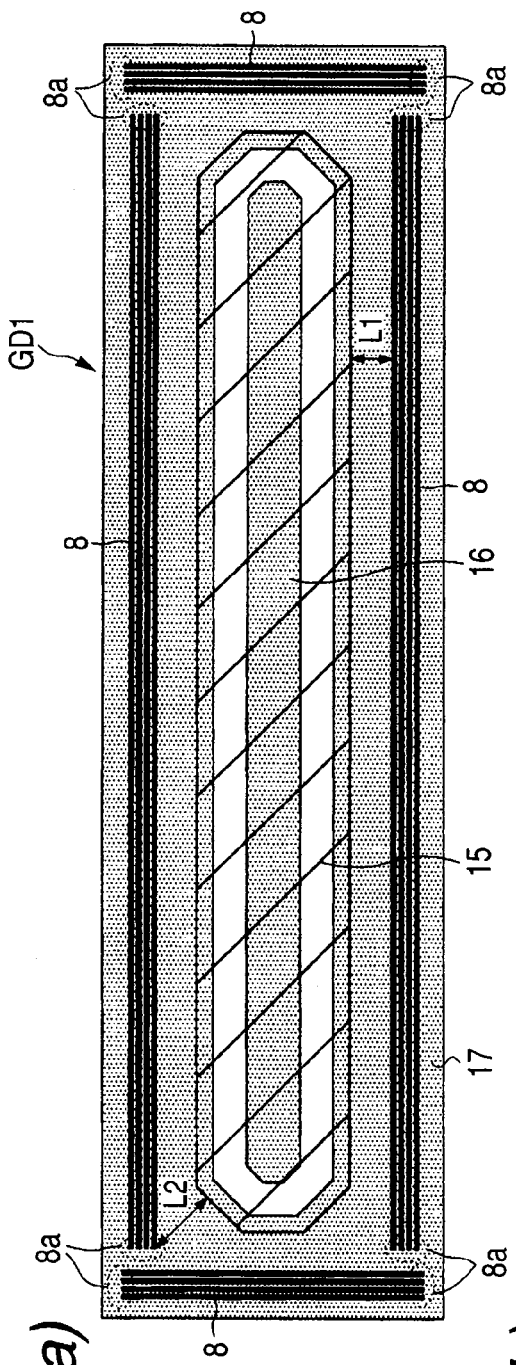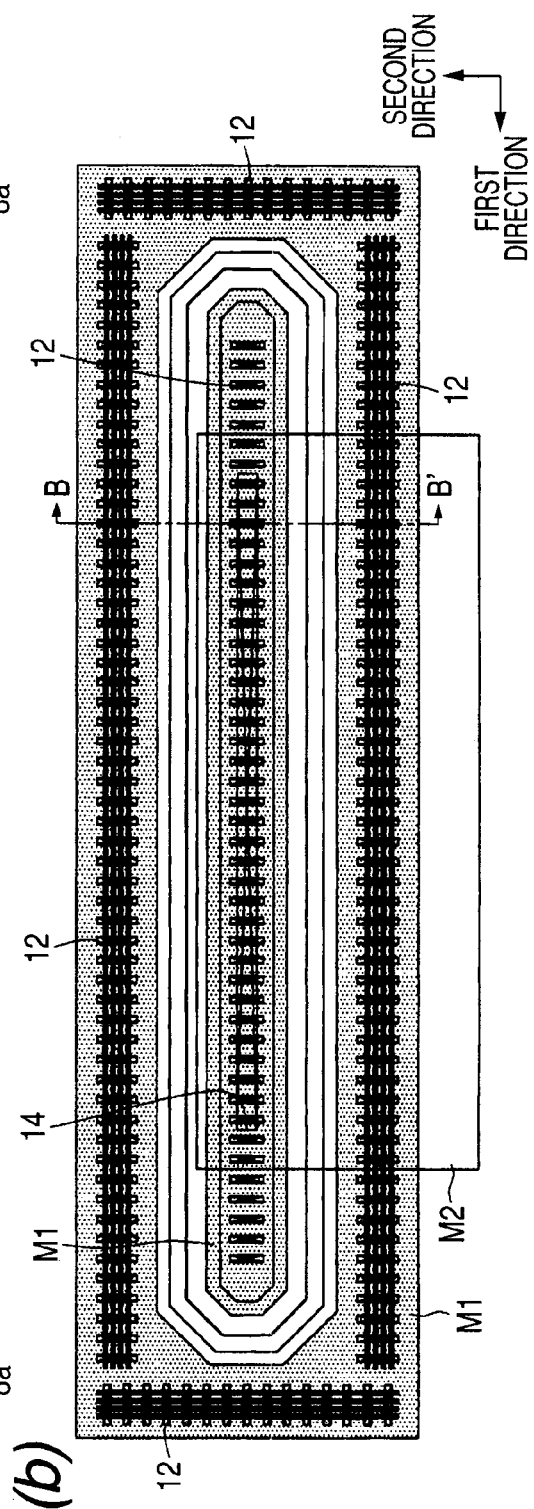
FIG. 6(a)
FIG. 6(b)

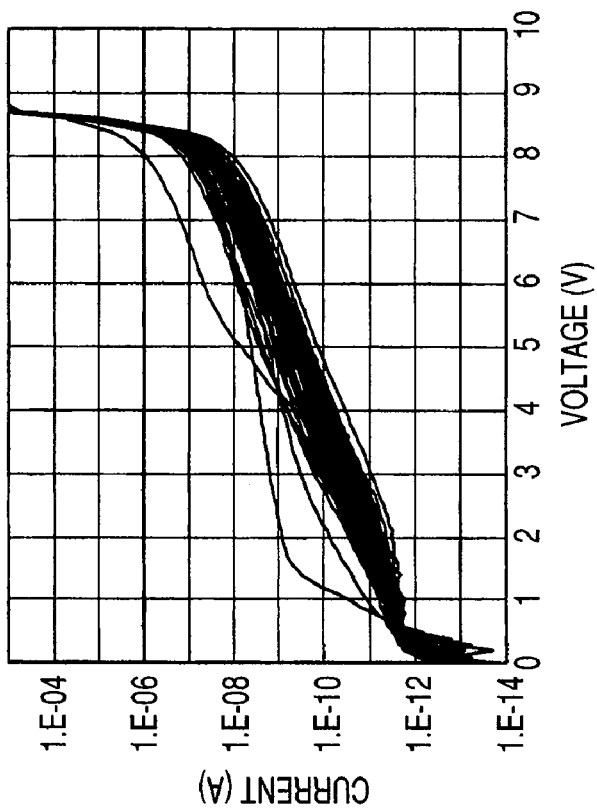
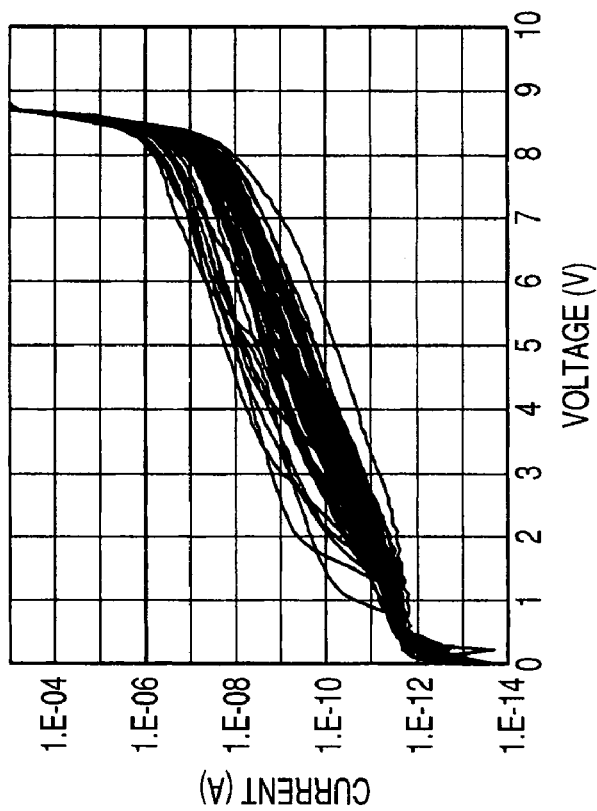

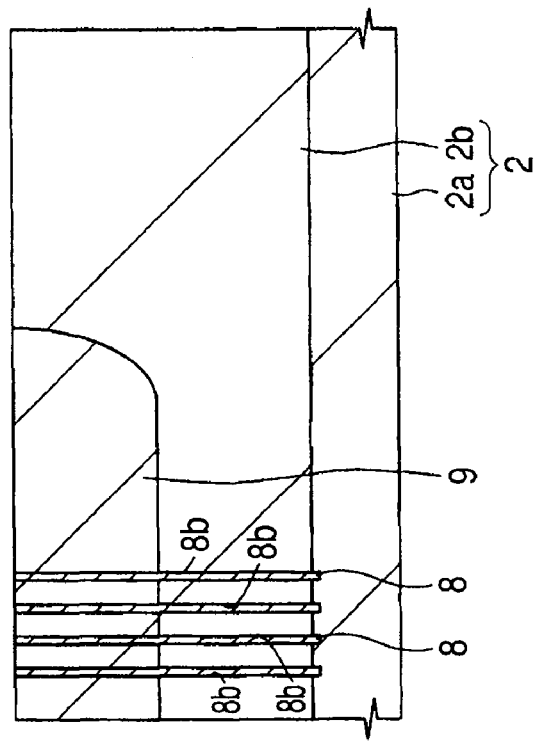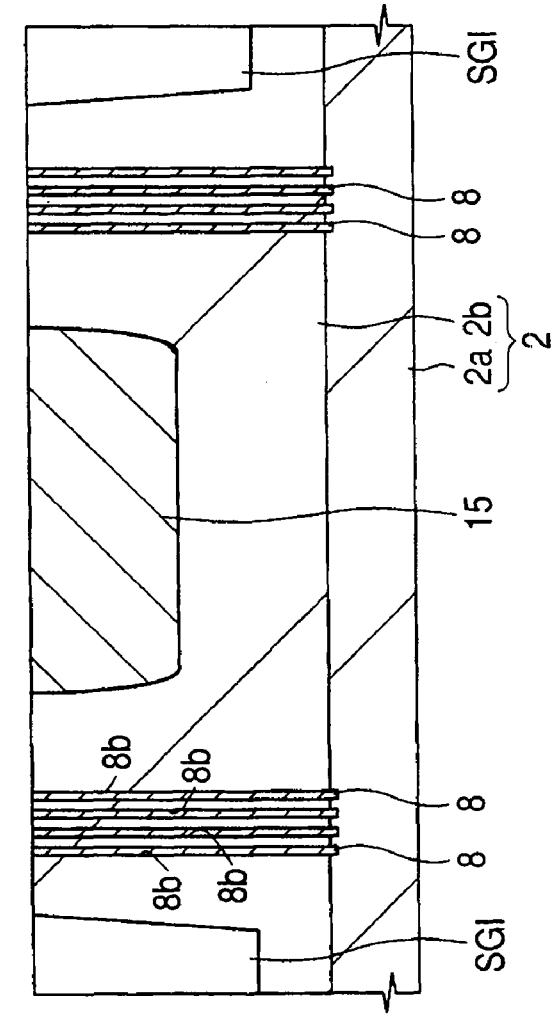

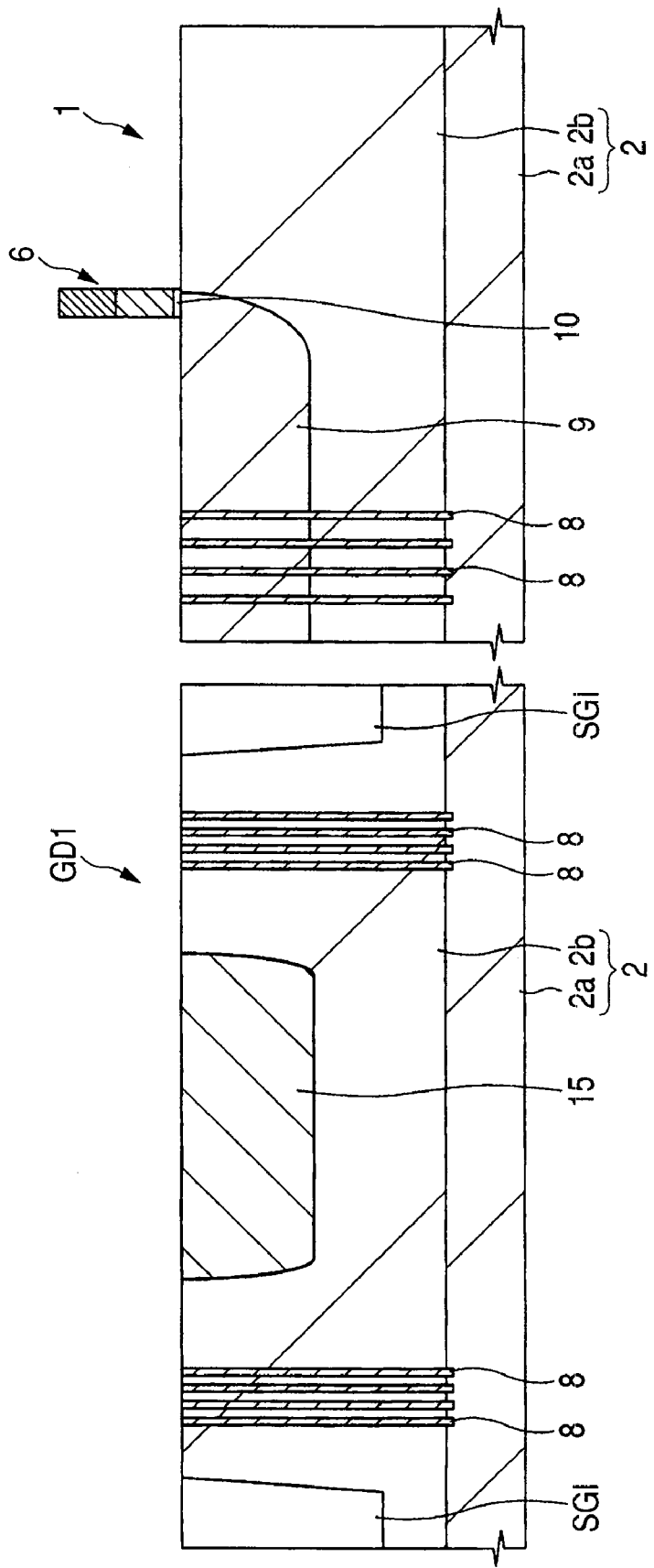

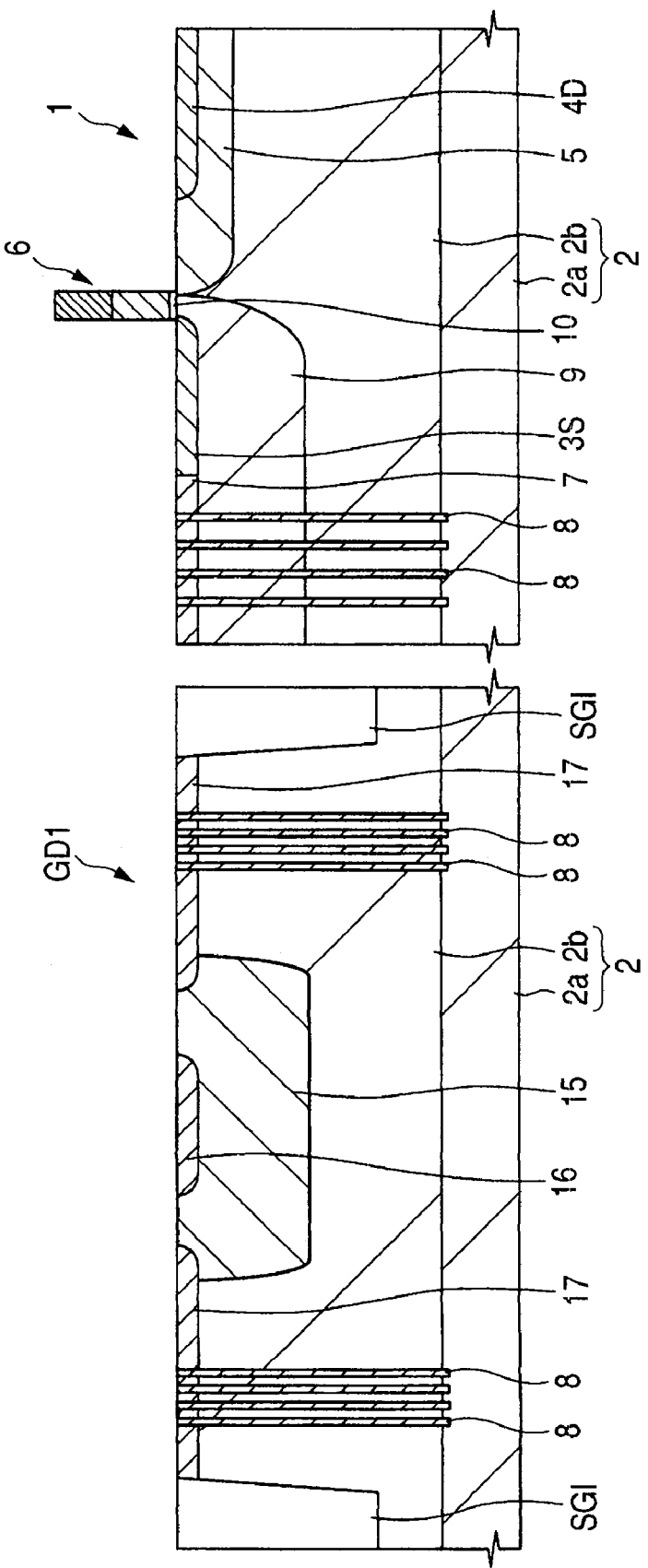

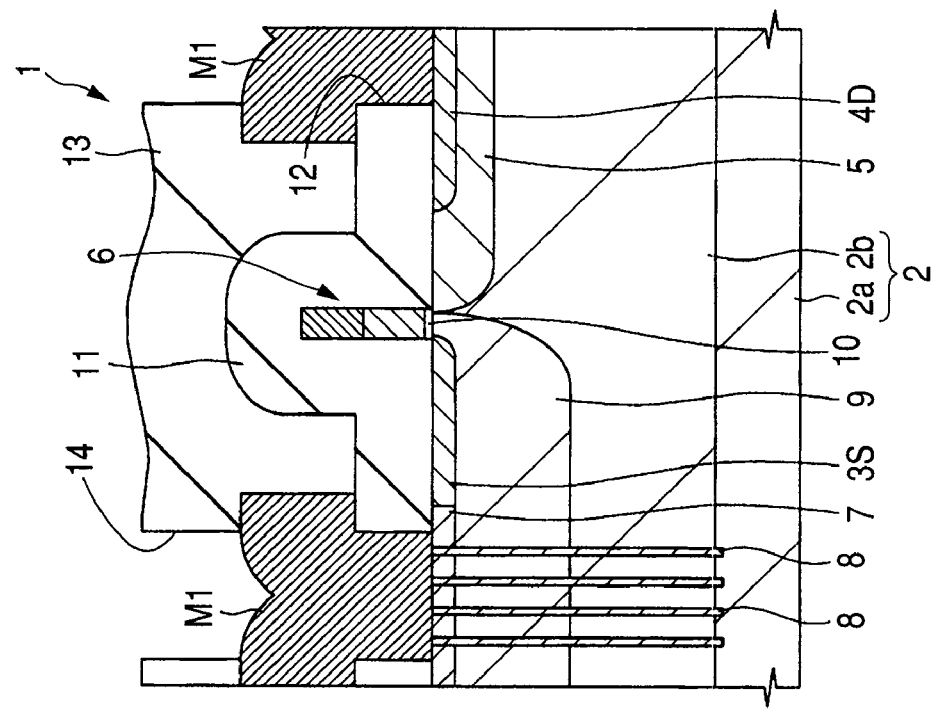
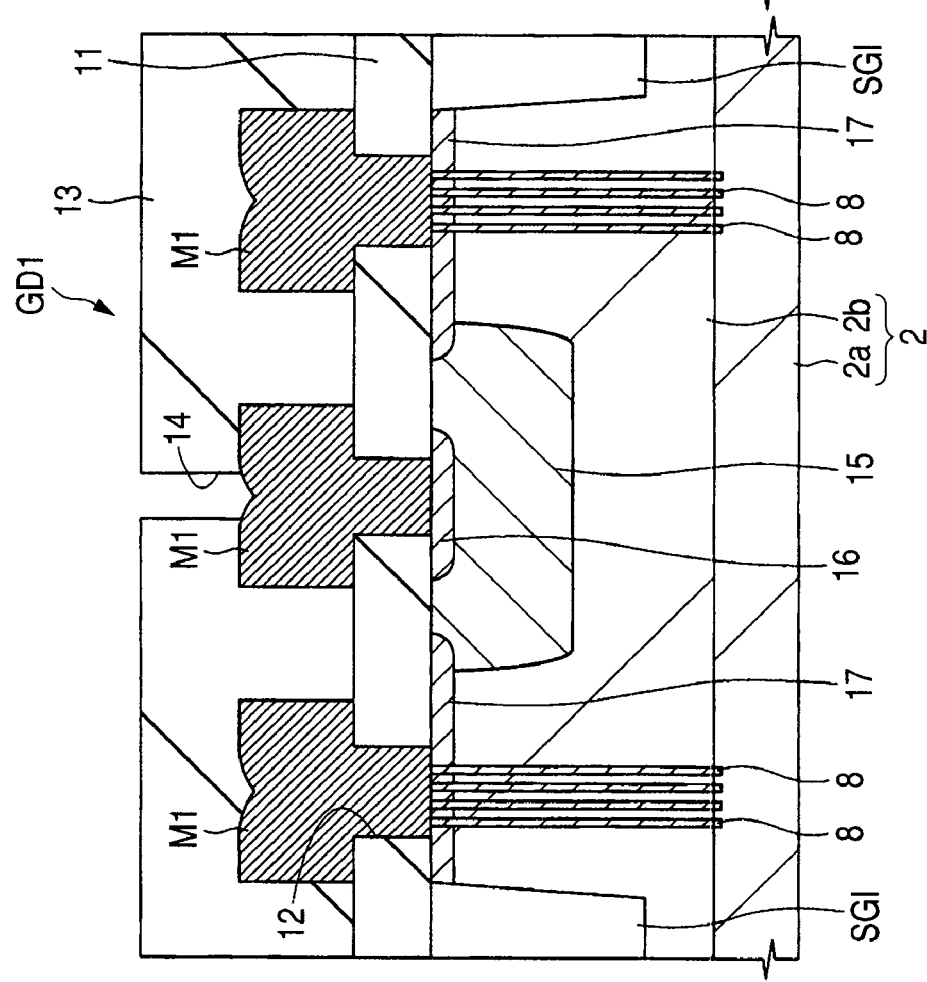

GATE PROTECTION DIODE FOR HIGH-FREQUENCY POWER AMPLIFIER

CROSS-REFERENCE TO RELATED APPLICATIONS

The disclosure of Japanese Patent Application No. 2007-331473 filed on Dec. 25, 2007 including the specification, drawings and abstract is incorporated herein by reference in its entirety.

BACKGROUND OF THE INVENTION

The present invention relates to a semiconductor device and, specifically, to a technology effective for a high-frequency power amplifier which is mounted in an RF module for mobile phones, amplifies the electric power of a high-frequency signal and outputs the amplified signal.

One of the constituent parts of a mobile phone is a high-frequency power amplifier for amplifying a high-frequency signal whose electric power has been modulated and supplying the amplified high-frequency signal to an antenna.

For example, Japanese Unexamined Patent Publication No. 2001-94094 (patent document 1) discloses a technology for reducing the size of a high-frequency amplifying field effect transistor having a drain off-set region and also the ON-resistance of the transistor by installing conductor plugs for pulling out electrodes over a source region, a drain region and a reach-through layer, coupling first layer wirings to these conductor plugs and further coupling second layer wirings for backing to the first layer wirings over the conductor plugs.

Japanese Unexamined Patent Application Publication (Translation of PCT Application) No. 2003-509867 (patent document 2) discloses a technology capable of preventing damage caused by the local concentration of a current in a high voltage-resistant device having a region doped in a low concentration and a contact zone doped in a high concentration in which a more constant current distribution is obtained due to resistance between a protective zone and the contact zone which is surrounded by the annular protective zone at a short interval in order to improve resistance to damage by a local break-down at the corner of the contact zone.

[patent document 1] Japanese Unexamined Patent Publication No. 2001-94094
[patent document 2] Japanese Unexamined Patent Application Publication (Translation of PCT Application) No. 2003-509867

SUMMARY OF THE INVENTION

A high-frequency power amplifier provided in a GSM (Global System for Mobile Communications) type mobile phone comprises two or three high-frequency power field effect transistors, gate protective diodes provided between the gate and source of each high-frequency power field effect transistor, and impedance matching circuits provided on the input side, the output side and between adjacent high-frequency power field effect transistors.

When the inventors of the present invention studied the improvement of the performance of this high-frequency power amplifier by improving the high-frequency characteristics of the high-frequency power field effect transistor, they found that it is effective to reduce the resistance of a silicon substrate configuring the high-frequency power field effect transistor. However, there arose a problem that the gate withstand pressure of the high-frequency power field effect transistor fluctuates when the resistance of the silicon substrate is reduced, thereby causing a gate withstand pressure failure very often. When the inventors of the present invention analyzed the problem, it was revealed that the gate withstand pressure failure of this high-frequency power field effect transistor was caused by an increase in the leak current of the gate protective diode.

That is, in order to improve the performance of the high-frequency power amplifier, the reduction of the resistance of the silicon substrate configuring the high-frequency power field effect transistor is effective. However, an increase in the leak current of the gate protective diode caused by this must be prevented.

It is an object of the present invention to provide a technology capable of improving the performance of a high-frequency power amplifier to be mounted in an RF module for mobile phones.

The above and other objects and novel feature of the present invention will become apparent from the description and accompanying drawings of the present invention.

A brief description is given of one embodiment of the invention disclosed by the present application.

The embodiment is a semiconductor device having high-frequency power field effect transistors and gate protective diodes which are coupled between the gates and the sources of the high-frequency power field effect transistors to protect the high-frequency power field effect transistors over a substrate comprising a p type substrate body and a p type semiconductor layer formed on the top of the substrate body. Each of the gate protective diode comprises an n type region formed over the main surface of the semiconductor layer surrounded by a device separator, a first p type region formed at the center of the main surface of this n type region, a second p type region formed over the main surface of the semiconductor layer around the n type region from the periphery of the main surface of the n type region, and p type buried layers which are buried in grooves formed in the semiconductor layer and couple the second p type region to the substrate body. The p type buried layers are formed around the n type region and have end portions formed by cutting on the planar shape, and the distance between the end portions and the n type region is set to 7 μm or more which is larger than the distance between portions other than the end portions and the n type region.

A brief description of an effect obtained by one embodiment of the invention disclosed by the present application is given below.

Since an increase in the leak current of the gate protective diode can be prevented even when the resistance of the silicon substrate is reduced, the performance of the high-frequency power amplifier can be improved by reducing the resistance of the silicon substrate to improve the high-frequency characteristics of the high-frequency power field effect transistor.

BRIEF DESCRIPTION OF THE DRAWINGS

FIGS. 6A and 6B are plan views of the key section of a gate protective diode according to Embodiment 1;

FIGS. 8A and 8B are graphs showing the leak current characteristics of a gate protective diode in which the end portions of $p^+$ type buried layers are 3 μm away from an n region and a gate protective diode in which the end portions of the $p^+$ type buried layers are 7 μm away from the n region;

FIGS. 11A and 11B are sectional views of the key sections of a gate protective circuit diode and a unit MIS configuring a high-frequency power MIS according to Embodiment 1, showing an example of the manufacturing process of these;

FIGS. 12A and 12B are sectional views of the key sections at the same locations as in FIGS. 11A and 11B in the course of manufacturing the gate protective circuit diode and the unit MIS configuring the high-frequency power MIS after FIGS. 11A and 11B;

FIGS. 13A and 13B are sectional views of the key sections at the same locations as in FIGS. 11A and 11B in the course of manufacturing the gate protective circuit diode and the unit MIS configuring the high-frequency power MIS after FIGS. 12A and 12B;

FIGS. 15A and 15B are sectional views of the key sections at the same locations as in FIGS. 11A and 11B in the course of manufacturing the gate protective circuit diode and the unit MIS configuring the high-frequency power MIS after FIGS. 12A and 12B;

DETAILED DESCRIPTION OF THE PREFERRED EMBODIMENTS

Figure 1:
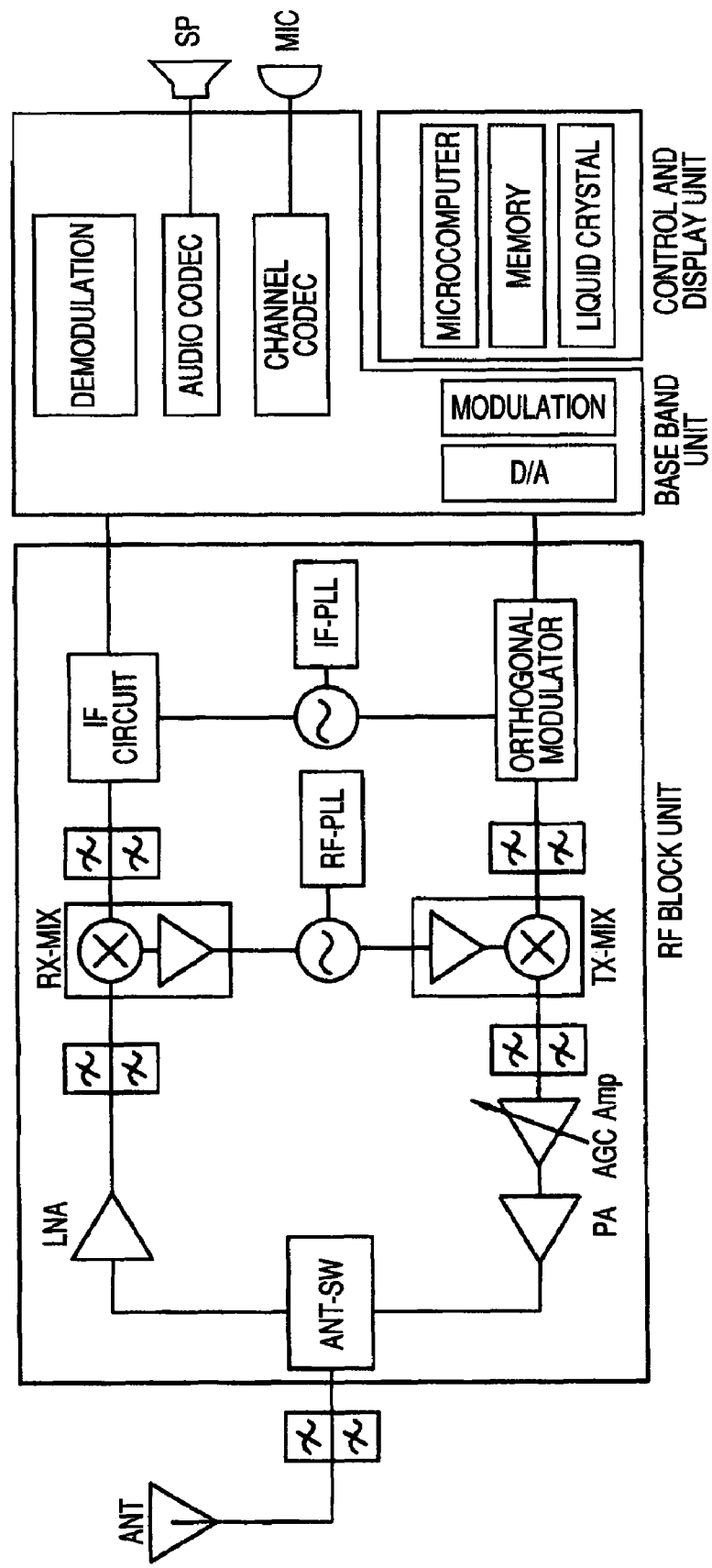
FIG. 1 is a block diagram of a digital mobile phone according to Embodiment 1.

The present invention will be described by dividing it into a plurality of sections or embodiments when necessary for convenience's sake. However, they are not irrelevant to each other, and one is a partial or whole modification, or detailed or supplementary explanation of the other except for a case where they are clearly specified.

When the number of elements (including the number, numerical value, quantity and range) is referred to in the embodiments of the present invention, except for a case where it is clearly specified or apparently limited to a specific number from the viewpoint of principles, it is not limited to a specific number and may be more or less than the specific number. Further, in the embodiments of the present invention, it is needless to say that constituent elements (including element steps) are not always essential except for a case where they are clearly specified or a case where they are apparently essential from the viewpoint of principles. Similarly, when the shape or position relationship of the constituent elements or the like is referred to, it includes an approximate or similar one except for a case where it is clearly specified or a case where it is apparently not so from the viewpoint of principles in the embodiments of the present invention. This can be said of the above numerical value and range.

In the drawings used in the embodiments of the present invention, even a plan view may be hatched for easy view. In the embodiments of the present invention, a MISFET (Metal Insulator Semiconductor Field Effect Transistor) which is a typical example of a field effect transistor is abbreviated as MIS. In the embodiments of the present invention, a wafer refers mainly to a Si (Silicon) monocrystal wafer but also to a SOI (Silicon On Insulator) wafer and an insulating film substrate for forming an integrated circuit thereon. The shape of the wafer may be circular or almost circular and may be square or rectangular.

In all the drawings for explaining the embodiments of the present invention, elements having the same function are denoted by the same reference symbols and their repeated explanations are omitted. The embodiments of the present invention will be described in detail below based on the drawings.

Embodiment 1

FIG. 1 is block diagram of a digital mobile phone according to Embodiment 1.

A signal received by an antenna ANT is guided to the reception side of an RF block unit through an antenna switch ANT-SW. After the received signal is amplified by a low-noise amplifier LNA, it is converted into an IF frequency of about 150 to 250 MHz by a reception mixer RX-MIX and further into a second IF frequency of about 455 kHz by an IF circuit and then guided to a base band unit to be demodulated.

A sound to be transmitted is first digitized into a signal by the base band unit. The digitized signal is converted into an analog signal by the base band unit and guided to the transmission side of the RF block unit as an I/Q signal. The I/Q signal is modulated into an IF frequency by an orthogonal modulator, converted into a transmission signal by a transmission mixer TX-MIX and amplified by a high-output amplifier PA. Thereafter, the transmission signal is guided to the antenna ANT through the antenna switch ANT-SW to be transmitted from the antenna ANT. A local signal is supplied to the reception mixer RX-MIX and the transmission mixer TX-MIX by a synthesizer RF-PLL comprising an oscillator and PLL. A local signal is also supplied to the IF circuit and the orthogonal modulator from a synthesizer IF-PLL comprising an oscillator and PLL. In FIG. 1, AGC Amp denotes an automatic gain control amplifier, SP a speaker and MIC a microphone.

Figure 2:
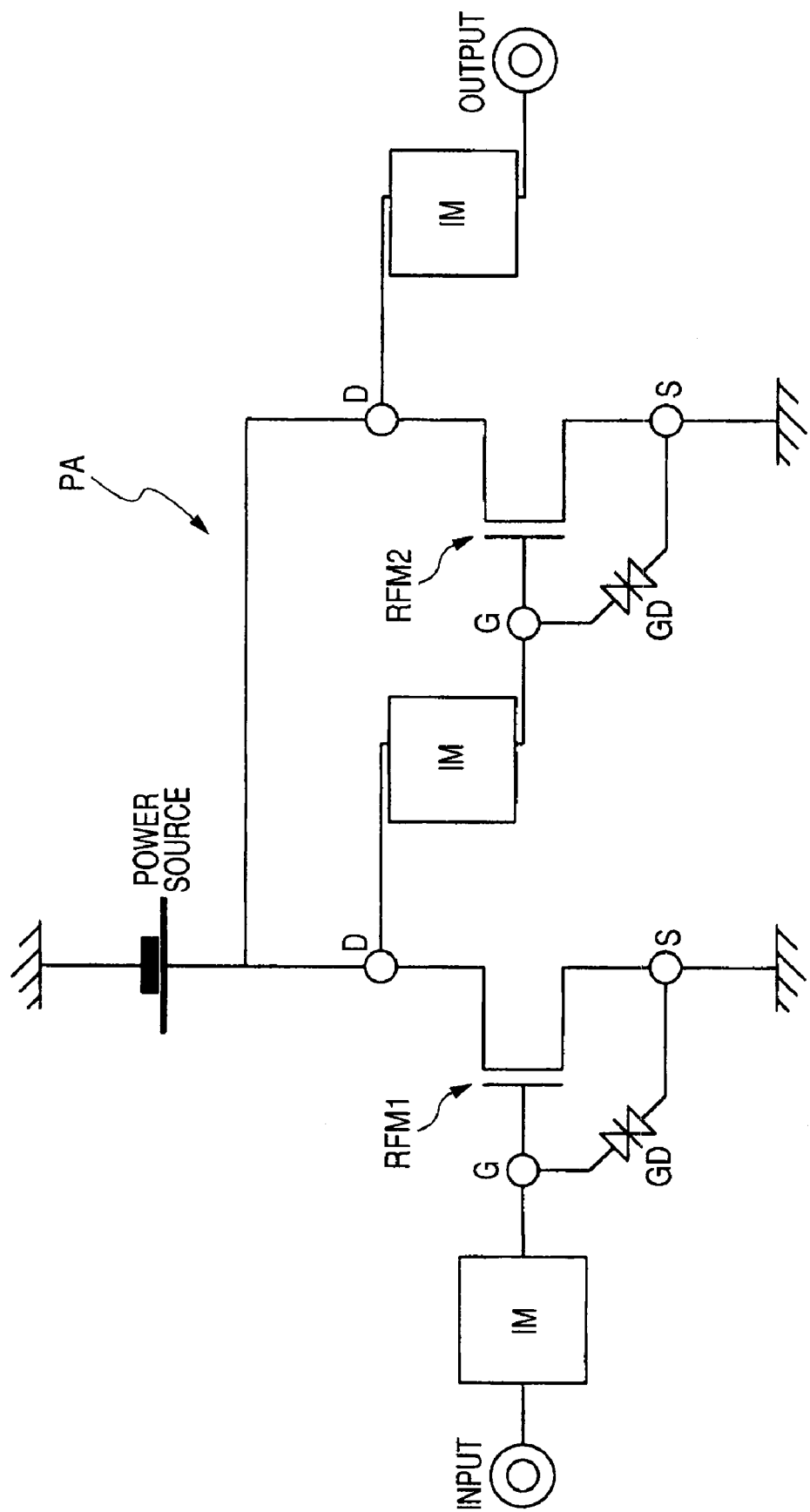
FIG. 2 is a diagram of a high-output amplifier according to Embodiment 1.

FIG. 2 is a diagram of a high-output amplifier according to Embodiment 1.

The high-output amplifier PA comprises two high-frequency silicon power MIS's (RFM1, RFM2), gate protective diodes GD provided between the gate G and source S of the first high-frequency silicon power MIS (RFM1) and between the gate G and source S of the second high-frequency silicon power MIS (RFM2), and impedance matching circuits IM provided on the input side, the output side and between the drain D of the first high-frequency silicon power MIS (RFM1) and the gate G of the second high-frequency silicon power MIS (RFM2). Each of the gate protective diodes GD has two diodes for plus voltage and minus voltage so as to prevent electrostatic breakdown at the time of handling. Although two high-frequency silicon power MIS's (RFM1, RFM2) are provided in this embodiment, the number of the high-frequency silicon power MIS's is not limited to this and may be 3.

Figure 3:
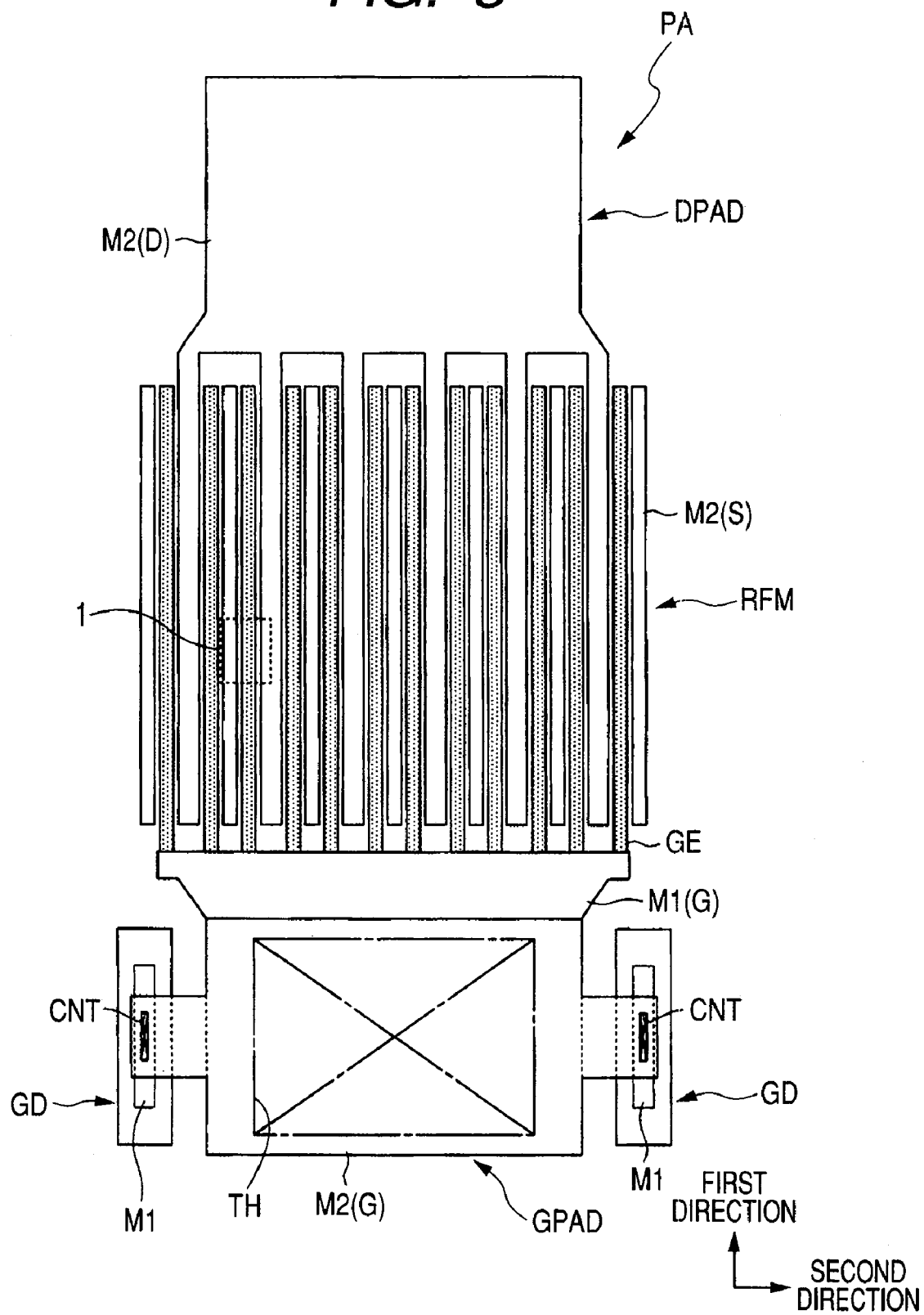
FIG. 3 is a lay-out diagram of a high-frequency silicon power MIS and gate protective circuit diodes provided in the high-frequency amplifier according to Embodiment 1.

FIG. 3 is a lay-out diagram of the high-frequency silicon power MIS's and the gate protective circuit diodes provided in the high-frequency amplifier according to Embodiment 1.

The high-frequency silicon power MIS (RFM) provided in the high-frequency amplifier PA comprises a large number of unit MIS's. In FIG. 3, the area shown by reference numeral 1 is a unit MIS.

In the high-frequency silicon power MIS (RFM), a plurality of, for example, 100 to 200 gate electrodes GE are arranged in a first direction and one end portions of the gate electrodes GE are coupled to the gate wirings M1 (G) of the first layer through connection holes. In FIG. 3, only 12 gate electrodes GE out of the 100 to 200 gate electrodes GE are shown. Further, the gate wirings M1 (G) of the first layer are coupled to a gate pad GPAD in which the gate wirings M1 (G) of the first layer are coupled to the gate wirings M2 (G) of the second layer through connection holes TH. Further, the gate wirings M2 (G) of the second layer are coupled to the gate wirings M1 of the first layer coupled to one p region configuring the pn junction of the gate protective diode GD through connection holes CNT. In this embodiment, two gate protective diodes are shown but the present invention is not limited to this.

A plurality of drain wirings M2 (D) of the second layer are arranged in the first direction. The drain wirings M2 (D) of the second layer are coupled to the drain region of the unit MIS1 through the wirings of the first layer and further to a drain pad DPAD.

A plurality of source wirings M2 (S) of the second layer are arranged in the first direction. The source wirings M2 (S) of the second layer are coupled to the source region of the unit MIS1 through the wirings of the first layer. Although the source wirings M2 (S) of the second layer are provided to reduce resistance, a source pad is not provided because the source potential of the high-frequency silicon power MIS (RFM) can be obtained on the rear surface of the substrate.

Figure 4:
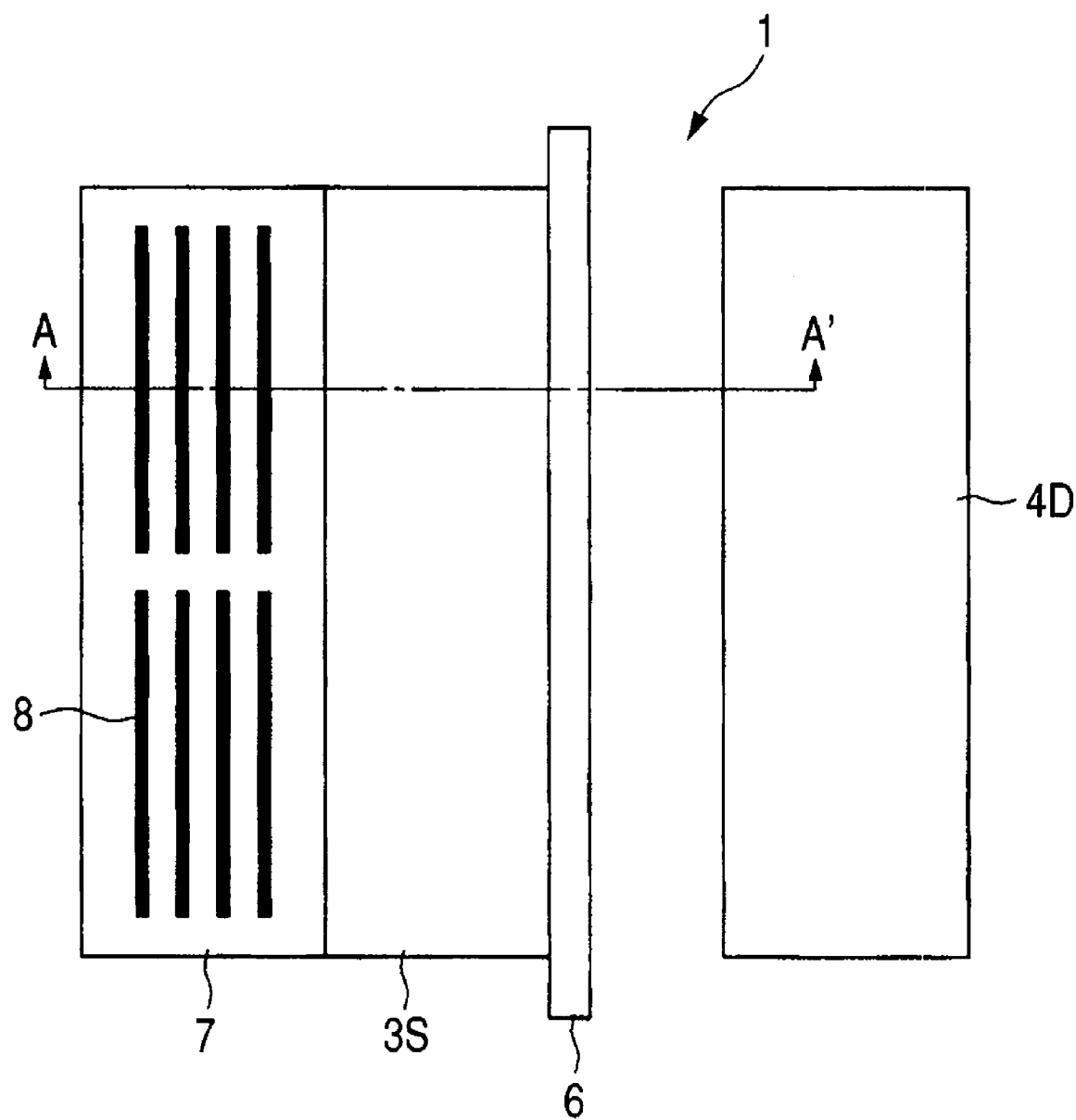
FIG. 4 is a plan view of the key section of an unit MIS configuring the high-frequency silicon power MIS according to Embodiment 1.
Figure 5:
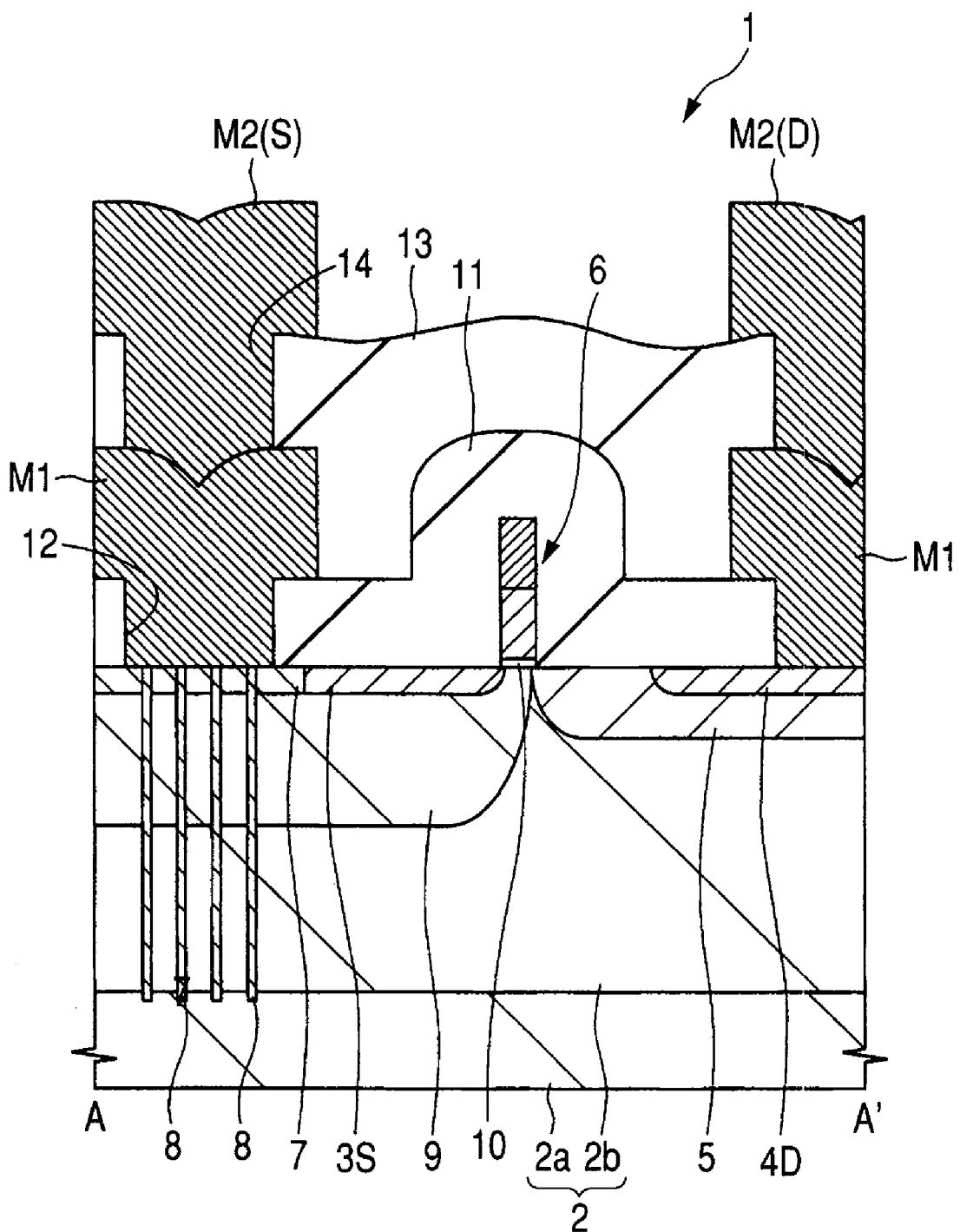
FIG. 5 is a sectional view of the key section cut on line A-A' of FIG. 4.

An example of the unit MIS configuring the high-frequency silicon power MIS provided in the high-frequency amplifier according to Embodiment 1 will be described with reference to FIG. 4 and FIG. 5. FIG. 4 is a plan view of the key section of the unit MIS configuring the high-frequency silicon power MIS and FIG. 5 is a sectional view of the key section cut on line A-A' of FIG. 4.

The unit MIS1 configuring the high-frequency silicon power MIS is formed over the main surface of a substrate 2. The substrate 2 has a substrate body 2a made of p type monocrystal silicon and a p type semiconductor layer, for example, epitaxial layer 2b, having higher resistance than that of the substrate body 2a and formed over the main surface of the substrate body 2a. The impurity concentration of the substrate body 2a is, for example, $1\times10^{19}$ to $1\times10^{20}$ cm$^{-3}$ and its resistivity is, for example, 1 to 2 mOcm. The impurity concentration of the epitaxial layer 2b is, for example, $3\times10^{14}$ to $3\times10^{15}$ cm$^{-3}$ and its resistivity is, for example, 10 to 20 Ocm. The thickness of the substrate body 2a is, for example, 280 μm and the thickness of the epitaxial layer 2b is, for example, 1 to 2 μm.

The unit MIS1 has a drain region and a source region formed in the epitaxial layer 2b. The drain region includes an n$^+$ type semiconductor region 4D and an n type semiconductor region 5 surrounding this n$^+$ type semiconductor region 4D. The n type semiconductor region 5 extends up to a portion below the end of the gate electrode 6 of the unit MIS1. The impurity concentration of the n$^+$ type semiconductor region 4D is, for example, $3\times10^{20}$ to $3\times10^{21}$ cm$^{-3}$. The n type semiconductor region 5 is provided to raise the drain withstand pressure of the unit MIS1 and its impurity concentration is, for example, $3\times10^{17}$ to $3\times10^{18}$ cm$^{-3}$ which is lower than the impurity concentration of the n$^+$ type semiconductor region 4D.

The source region includes an n$^+$ type semiconductor region 3S and a p$^+$ type semiconductor region 7. The impurity concentration of the n$^+$ type semiconductor region 3S is, for example, $5\times10^{20}$ to $5\times10^{21}$ cm$^{-3}$ and extends up to a portion below the end of the gate electrode 6 of the unit MIS1. The p$^+$ type semiconductor region 7 is separated from the gate electrode 6 by the n$^+$ type semiconductor region 3S. The p$^+$ type semiconductor region 7 is electrically coupled to the substrate body 2a through a plurality of (8 in this Embodiment 1) groove-like p$^+$ type buried layers 8 from the front surface of the epitaxial layer 2b toward the rear surface. The width of each of the grooves configuring the p$^+$ type buried layers 8 is, for example, 0.3 μm. The impurity concentration of the p$^+$ type semiconductor region 7 is, for example, $1\times10^{20}$ to $1\times10^{21}$ cm$^{-3}$ and the impurity concentration of each of the p$^+$ type buried layers 8 is, for example, $1\times10^{20}$ to $1\times10^{21}$ cm$^{-3}$.

The n$^+$ type semiconductor region 3S and the p$^+$ type semiconductor region 7 configuring the source region are surrounded by a p type semiconductor region 9. The p type semiconductor region 9 extends up to a region where a channel is formed below the gate electrode 6 of the unit MIS1 and functions as a punch through stopper for suppressing the extension of a depletion layer from the drain region to the source region.

A gate insulating film 10 having a thickness of, for example, 10 nm and composed of a silicon oxide film is formed over the surface of the epitaxial layer 2b between the source region and the drain region, and a gate electrode 6 having a thickness of, for example, 0.2 μm and composed of a conductor material is formed over the gate insulating film 10. The above conductor material may be a laminate comprising a polycrystal silicon film and a tungsten silicide film. The gate length of the gate electrode 6 is, for example, 0.2 μm.

An insulating film 11 is formed over the main surface of the epitaxial layer 2b to cover the gate electrode 6, the source region and the drain region, and the wirings M1 of the first layer are coupled to the source region and the drain region through connection holes 12 formed in this insulating film 11. Further, an insulating film 13 is formed over the main surface of the epitaxial layer 2b to cover the wirings M1 of the first layer, the source wiring M2 (S) of the second layer is coupled to the wiring M1 of the first layer coupled to the source region through a connection hole 14 formed in this insulating film 13, and the drain wiring M2 (D) of the second layer is coupled to the wiring M1 of the first layer coupled to the drain region.

In the unit MIS1, a current runs through a path from the n$^+$ type semiconductor region 4D as a drain region to the n type semiconductor region 5 as a drain region, the p type semiconductor region 9 (channel region) below the gate electrode 6, the n$^+$ type semiconductor region 3S as a source region, the p$^+$ type semiconductor region 7 as a source region, the p$^+$ type buried layers 8 and the substrate body 2a. The location where the flow rate of the current is controlled most in this path is the substrate body 2a. The reason for this is that the thickness of the substrate body 2a is larger than those of the other constituent parts. That is, as described above, the thickness of the p$^+$ type buried layer 8 (almost the same as that of the epitaxial layer 2b) is, for example, 1 to 2 μm whereas the thickness of the substrate body 2a is, for example, 280 μm which is two-digit larger than the thickness of the p$^+$ type buried layer 8. Therefore, to improve the high-frequency characteristics of the high-frequency silicon power MIS and further the performance of the high-frequency amplifier, the reduction of the resistance of the substrate body 2a of the unit MIS1 configuring the high-frequency silicon power MIS is effective. To this end, the impurity concentration of the substrate body 2a is set to a large value of $1\times10^{19}$ to $1\times10^{20}$ cm$^{-3}$.

Figure 7:
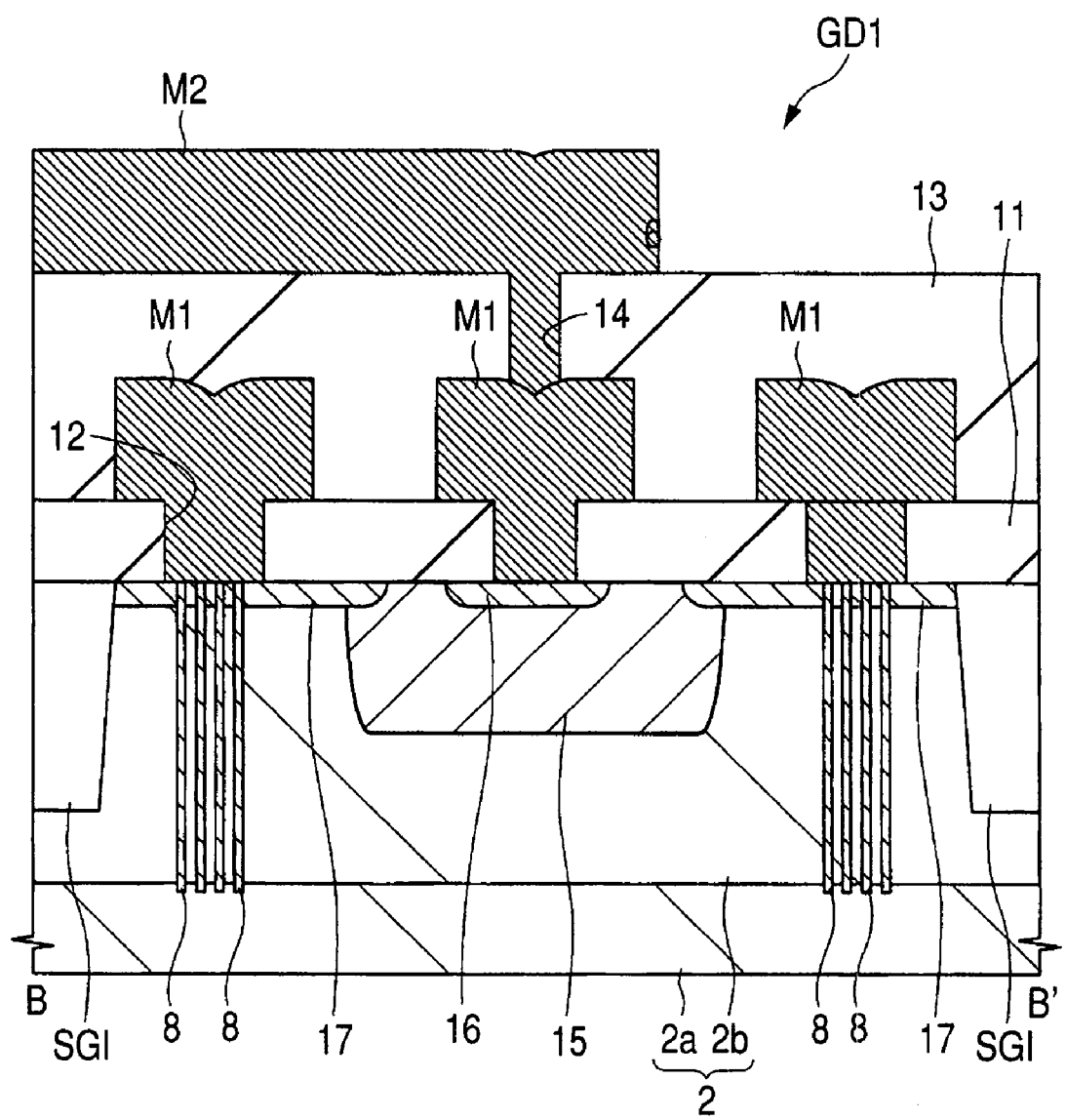
FIG. 7 is a sectional view of the key section cut on line B-B' of FIG. 6B.

An example of the gate protective diode provided in the high-frequency amplifier according to Embodiment 1 will be described with reference to FIGS. 6A and 6B and FIG. 7. FIGS. 6Aa d 6B are plan views of the key section of the gate protective diode before and after the formation of wirings and FIG. 7 is a sectional view of the key section cut on line B-B' of FIG. 6B.

The gate protective diode GD1 is formed over the epitaxial layer 2b surrounded (defined) by a device separator SGI. The planar shape of the gate protective diode GD1 is rectangular with a size in the first direction of 100 μm and a size in the second direction orthogonal to the first direction of 25 μm. The gate protective diode GD1 is formed over the main surface of the substrate 2 comprising the substrate body 2a and the epitaxial layer 2b like the unit MIS1 configuring the above-described high-frequency silicon power MIS.

The gate protective diode GD1 has two pn junctions constructed by p regions and an n region formed in the epitaxial layer 2b. In this Embodiment 1, the structure of the gate protective diode GD1 is comprised of a first p region, an n region and a second p region, and the first p region is electrically coupled to the gate G of the high-frequency silicon power MIS (RFM1, RFM2) and the second p region is electrically coupled to the source S of the high-frequency silicon power MIS (RFM1, RFM2) as described with reference to FIG. 2.

The n region is composed of an n$^+$ type semiconductor region 15 formed at the center of the surface of the epitaxial layer 2b. The first p region is composed of a p$^+$ type semiconductor region formed at the center of the surface of the n$^+$ type semiconductor region 15, and a gate voltage is applied to the p$^+$ type semiconductor region 16 by the electric coupling of a gate configuring the high-frequency silicon power MIS. The impurity concentration of the n$^+$ type semiconductor region 15 is, for example, $1\times10^{17}$ to $1\times10^{18}$ cm$^{-3}$, and the impurity concentration of the p$^+$ type semiconductor region 16 is, for example, $1\times10^{20}$ to $1\times10^{21}$ cm$^{-3}$.

The second p region is composed of a p$^+$ type semiconductor region 17 formed at the periphery of the surface of the n$^+$ type semiconductor region 15 configuring the n region without contact with the above p$^+$ type semiconductor region 16, and a source voltage (GND) is applied to the p$^+$ type semiconductor region 17 by the electric coupling of a source configuring the high-frequency silicon power MIS. This p$^+$ type semiconductor region 17 is also formed over the surface of the epitaxial layer 2b surrounding the n$^+$ type semiconductor region 15 and electrically coupled to the substrate body 2a through the groove-like p$^+$ type buried layers 8 formed from the front surface of the epitaxial layer 2b toward the rear surface. The impurity concentration of the p$^+$ type semiconductor region 17 is, for example, $10\times10^{20}$ to $1\times10^{21}$ cm$^{-3}$.

By electrically coupling the p$^+$ type semiconductor region 17 formed over the surface of the epitaxial layer 2b to the substrate body 2a, the second p region can be made electrically conductive from the front side (p$^+$ type semiconductor region 17 formed over the surface of the epitaxial layer 2b) or rear side (substrate body 2a) of the chip, thereby increasing the degree of freedom of coupling the second p region in the inspection step or the mounting step. For example, in the chip selecting step in which the defective state of the gate protective diode GD1 is inspected from the state of a wafer, inspection is carried out between the p$^+$ type semiconductor region 16 and the p$^+$ type semiconductor region 17 whereas in the product inspection step in which the state of the chip is inspected after the gate protective diode GD1 is incorporated into a product, inspection can be carried out between the p$^+$ type semiconductor region 16 and the rear surface of the substrate 2.

The p$^+$ type buried layers 8 are formed on both sides of the long sides of the n$^+$ type semiconductor region 15 configuring the n region in the direction where the long sides of the epitaxial layer 2b surrounded by the device separator SGI extend (first direction) and on both sides of the short sides of the n$^+$ type semiconductor region 15 configuring the n region in the direction where the short sides of the epitaxial layer 2b surrounded by the device separator SGI extend (second direction). That is, the p$^+$ type buried layers 8 are formed in the peripheral portion of the epitaxial layer 2b over which the gate protective diode GD1 is formed and has end portions 8a formed by cutting the p$^+$ type buried layers 8 at positions close to the four corners of the epitaxial layer 2b.

Further, though the p$^+$ type buried layers 8 extending in the first direction are, for example, 3 μm (L1 in FIG. 6A) away from the n$^+$ type semiconductor region 15 configuring the n region, the end portions 8a of the p$^+$ type buried layers 8 are, for example, 7 μm (L2 in FIG. 6A) away from the n$^+$ type semiconductor region 15 configuring the n region. Since the end portions 8a of the p$^+$ type buried layers 8 are 7 μm away from the n$^+$ type semiconductor region 15, the planar shape of the n$^+$ type semiconductor region 15 configuring the n region is rectangular without four corners (polygonal having 8 sides in Embodiment 1).

In the gate protective diode GD1, four p$^+$ type buried layers 8 are formed parallel to each other at predetermined intervals on both sides of the long sides and both sides of the short sides of the n$^+$ type semiconductor region 15 configuring the n region. The number of the p$^+$ type buried layers 8 is not limited to this and may be 3 or less or 5 or more.

The insulating film 11 is formed over the main surface of the epitaxial layer 2b to cover the n region, the first p region and the second p region, and the wirings M1 of the first layer are coupled to the p$^+$ type semiconductor region 16 configuring the first p region and the p$^+$ type semiconductor region 17 configuring the second p region through the connection holes 12 formed in this insulating film 11. Further, the insulating film 13 is formed over the main surface of the epitaxial layer 2b to cover the wirings M1 of the first layer, and the wirings M2 of the second layer are coupled to the wirings M1 of the first layer coupled to the p$^+$ type semiconductor region 16 through the connection holes 14 formed in this insulating film 13. The wirings M2 of the second layer are identical to the gate wirings M2 (G) of the second layer coupled to the gate pad GPAD which has been described with reference to FIG. 3.

Strong stress is produced in the end portions 8a of the p$^+$ type buried layers 8, especially the end portions 8a of the p$^+$ type buried layers 8 formed on both sides of the long sides in the first direction of the n$^+$ type semiconductor region 15 configuring the n region and induces a defect which becomes the cause of the leak current of the gate protective diode GD1. The reason that strong stress is produced in the end portions 8a of the p+ type buried layers 8 is that the lattice constant becomes small as the substrate body 2a made of monocrystal silicon having low resistance contains a large amount of a p type impurity having a smaller atomic number than that of silicon, for example, boron. Strong stress produced in the end portions of the p+ type buried layers 8 twists the epitaxial layer 2b through the p+ type buried layers 8 to induce a defect which becomes the cause of increasing the leak current of the gate protective diode GD1. Although the reduction of the resistance of the substrate body 2a configuring the high-frequency silicon power MIS is effective so as to improve the high-frequency characteristics of the high-frequency silicon power MIS, the amount of the p type impurity contained in the substrate body 2a, for example, boron increases and the number of defects which become the cause of increasing the leak current of the gate protective diode GD1 induced thereby increases as well.

However, since the end portions 8a of the p+ type buried layers 8 are 7 μm separated from the n+ type semiconductor region 15 in the gate protective diode GD1 according to Embodiment 1, even when a defect is induced by stress produced in the end portions 8a of the p+ type buried layers 8, its influence upon the leak current of the gate protective diode GD1 becomes small. Therefore, even when the impurity concentration of the substrate body 2a is set to a large value of $1\times10^{19}$ to $1\times10^{20}$ cm$^{-3}$, an increase in the leak current of the gate protective diode GD1 can be prevented.

Figure 9:
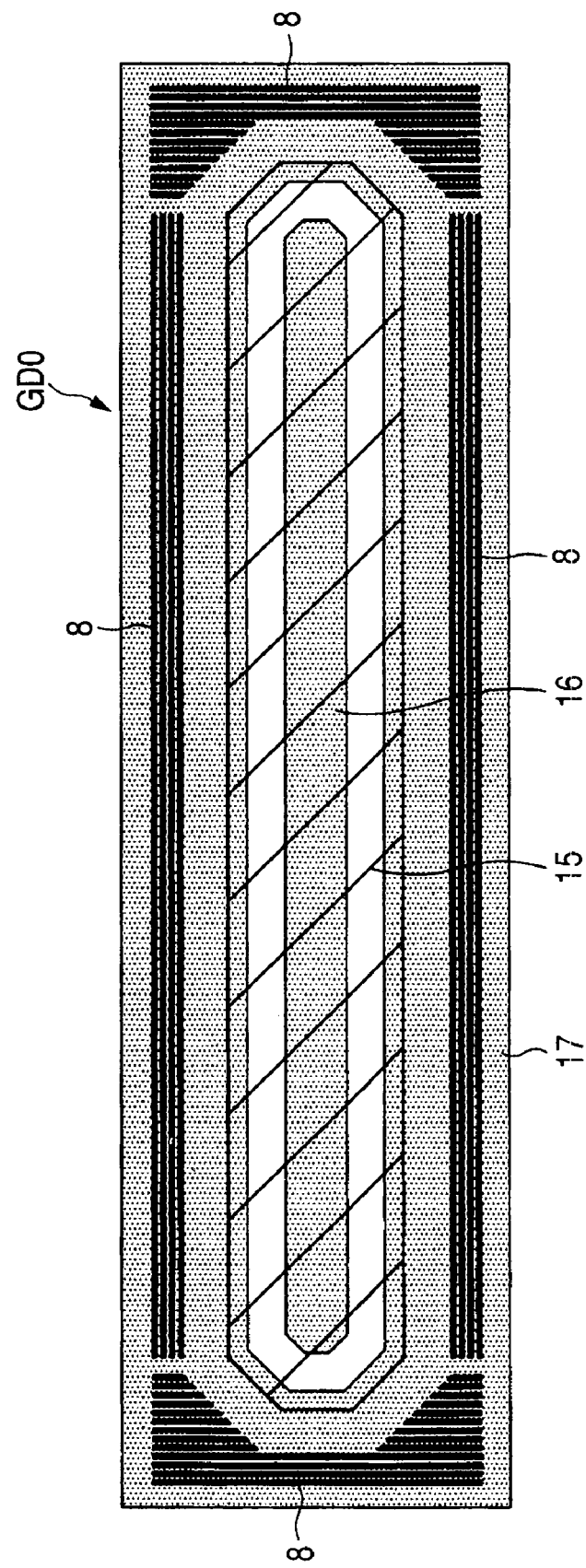
FIG. 9 is a plan view of the key section of a gate protective diode in which the end portions of the $p^+$ type buried layers are 3 μm away from the n region as studied by the inventors of the present invention.

A description is subsequently given of the leak current characteristics of the gate protective diode according to Embodiment 1. FIGS. 8A and 8B are graphs showing the leak current characteristics of a gate protective diode in which the end portions of the p+ type buried layers 8 are 3 μm away from the n+ type semiconductor region and a gate protective diode in which the end portions of the p+ type buried layers 8 are 7 μm away from the n+ type semiconductor region, respectively. FIG. 8A shows the leak current characteristics of the gate protective diode of the prior art which the inventors of the present invention studied as the premise of the present invention. FIG. 9 is a plan view of the key section of the gate protective diode used for measurement. FIG. 8B shows the leak current characteristics of the gate protective diode GD1 according to Embodiment 1 which was described with reference to FIGS. 6A and 6B and FIG. 7.

As shown in FIG. 8A, in the gate protective diode GD0 in which the end portions of the p+ type buried layers 8 are 3 μm away from the n+ type semiconductor region, the gate withstand pressure regulated by a leak current of 1 μA greatly varies and a failure is found here and there. Meanwhile, as shown in FIG. 8B, in the gate protective diode GD1 in which the end portions of the p+ type buried layers 8 are 7 μm away from the n+ type semiconductor region, the gate withstand pressure regulated by a leak current of 1 μA is uniform and a failure is rarely seen. However, even in the gate protective diode GD1 in which the end portions of the p+ type buried layers 8 are 7 μm away from the n+ type semiconductor region, a low gate withstand pressure is seen. Therefore, it is considered that the distance between the end portions of the p+ type buried layers and the n+ type semiconductor region needs to be at least 7 μm.

Figure 10:
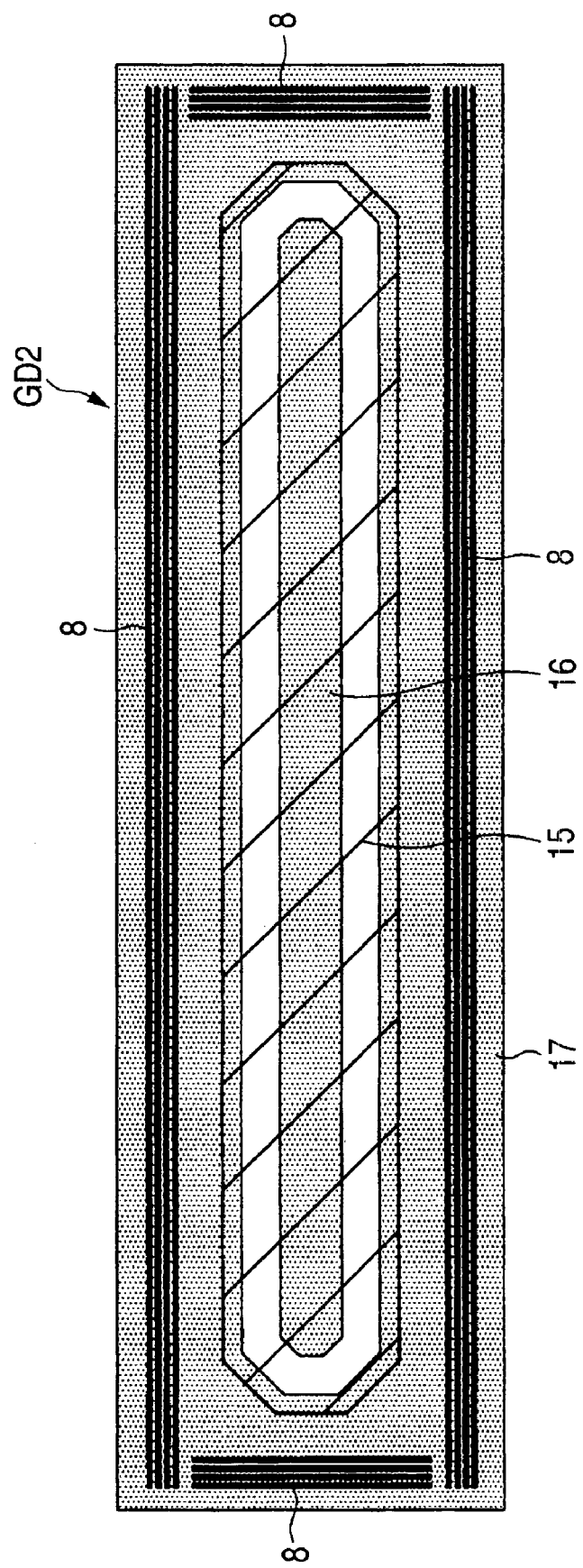
FIG. 10 is a plan view of the key section of a modification of the gate protective diode according to Embodiment 1.

FIG. 10 shows a modification of the gate protective diode provided in the high-frequency amplifier according to Embodiment 1. FIG. 10 is a plan view of the key section of the modification of the gate protective diode GD1.

Since stress produced in the end portions 8a of the p+ type buried layers 8 becomes strong when the length of each of the p+ type buried layers 8 becomes large, it is desired that the end portions 8a of the p+ type buried layers 8 provided on both sides of the long sides of the n+ type semiconductor region 15 configuring the n region should be separate farther from the n+ type semiconductor region 15. Then, as a modification of the gate protective diode GD1 shown in FIGS. 6A and 6B, a gate protective diode GD2 is shown in FIG. 10.

In the gate protective diode GD1 shown in FIGS. 6A and 6B, the length of each of the p+ type buried layers 8 provided on both sides of the long sides of the n+ type semiconductor region 15 configuring the n region is almost the same as the length of the long sides of the n+ type semiconductor region 15, and the length of each of the p+ type buried layers 8 provided on both sides of the short sides of the n+ type semiconductor region 15 configuring the n region is larger than the length of the short sides of the n+ type semiconductor region 15. In contrast to this, in the gate protective diode GD2 shown in FIG. 10, the length of each of the p+ type buried layers 8 provided on both sides of the long sides of the n+ type semiconductor region 15 configuring the n region is larger than the length of the long sides of the n+ type semiconductor region 15, and the length of each of the p+ type buried layers 8 provided on both sides of the short sides of the n+ type semiconductor region 15 configuring the n region is almost the same as the length of the short sides of the n+ type semiconductor region 15.

Therefore, the end portions 8a of the p+ type buried layers 8 provided on both sides of the long sides of the n+ type semiconductor region 15 configuring the n region are farther from the n+ type semiconductor region 15 and the influence of a defect induced by stress produced in the end portions 8a of the p+ type buried layers 8 can be made smaller in the gate protective diode GD2 shown in FIG. 10 than those of the gate protective diode GD1 shown in FIGS. 6A and 6B. That is, an increase in the leak current can be prevented more by employing the arrangement of the p+ type buried layers 8 in the gate protective diode GD2 than in the gate protective diode GD1.

An example of the process of manufacturing a unit MIS and a gate protective circuit diode configuring the high-frequency silicon power MIS according to Embodiment 1 will be described step by step with reference to FIGS. 11A and 11B to 15A and 15B. FIGS. 11A and 11B to FIGS. 15A and 15B are sectional views of the key sections of the gate protective circuit diode and the unit MIS configuring the high-frequency silicon power MIS, respectively.

As shown in FIGS. 11A and 11B, a substrate (thin semiconductor board having a substantially circular plane called "semiconductor wafer" in this stage) 2 having a substrate body 2a and an epitaxial layer 2b formed over the main surface of the substrate body 2a is first prepared. The substrate body 2a is made of p type monocrystal silicon formed by a crystal pulling method such as Czochralski method and has a thickness of, for example, 280 μm and a resistivity of less than 3 mOcm, for example, 1 to 2 mOcm. The epitaxial layer 2b is made of p type monocrystal silicon formed by an epitaxial method and has a thickness of, for example, 1 to 2 μm and a resistivity of, for example, 10 to 20 Ocm. Subsequently, a field insulating film made of, for example, silicon oxide is formed over the main surface of the epitaxial layer 2b by LOCOS (Local Oxidization of Silicon). The area where this field insulating film is formed may be defined as a device separator SGI.

After a resist pattern is formed on the main surface of the epitaxial layer 2b by photolithography, a predetermined number of grooves 8b reaching the substrate body 2a are formed at predetermined locations of the epitaxial layer 2b by using this resist pattern as a mask. Thereafter, a conductive film composed of a polycrystal silicon film is deposited over the main surface of the epitaxial layer 2b and further the conductive film except for the insides of the grooves 8b is polished by CMP (Chemical Mechanical Polishing) or the like to form a p$^+$ type buried layer 8 in the grooves 8b.

Then, a p type impurity such as boron is selectively ion injected into the epitaxial layer 2b by using the resist pattern as a mask to form a p type semiconductor region 9 for the unit MIS1 over the main surface of the epitaxial layer 2b. The p type semiconductor region 9 becomes a channel area for the unit MIS1.

Subsequently, an n type impurity such as phosphorus is selectively ion injected into the epitaxial layer 2b by using a resist pattern as a mask to form an n$^+$ type semiconductor region 15 which serves as the n region of the gate protective diode GD1 over the main surface of the epitaxial layer 2b.

Then, as shown in FIGS. 12A and 12B, a wet oxidation treatment is carried out while the substrate 2 is cleaned to expose the cleaned surface of the main surface of the epitaxial layer 2b so as to form a gate insulating film 10 composed of a silicon oxide film having a thickness of, for example, 10 nm over the main surface of the epitaxial layer 2b. Subsequently, a conductive film such as a polycrystal silicon film having low resistance and a silicide film such as a tungsten silicide film are deposited over the main surface of the epitaxial layer 2b in this order by CVD (Chemical Vapor Deposition) and patterned by photolithography and dry etching to form a gate electrode 6 comprised of the conductive film and the silicide film. The gate length of the gate electrode 6 is, for example, 0.2 µm. Gm can be improved by shortening the gate length so as to increase the running speed of an electron under the gate electrode 6. Thereafter, the substrate 2 is annealed by, for example, RTA (Rapid Thermal Annealing).

Then, as shown in FIGS. 13A and 13B, an n type impurity such as phosphorus is selectively ion injected into the epitaxial layer 2b by using a resist pattern as a mask to form an n type semiconductor region 5 which serves as part of the drain of the unit MIS1. The n type semiconductor region 5 is formed in such a manner that its end portion is overlapped (almost aligned) with the end portion on the drain side of the gate electrode 6.

Subsequently, an n type impurity such as arsenic is selectively ion injected into the epitaxial layer 2b by using a resist pattern as a mask to form an n$^+$ type semiconductor region 3S which serves as part of the source of the unit MIS1 and an n$^+$ type semiconductor region 4D which serves as the other part of the drain. The n$^+$ type semiconductor region 3S is formed in such a manner that its end portion is overlapped (almost aligned) with the end portion on the source side of the gate electrode 6. The n$^+$ type semiconductor region 4D is formed in such a manner that its end portion is a predetermined distance away from the gate electrode 6.

Subsequently, a p type impurity such as boron fluoride is selectively ion injected into the epitaxial layer 2b by using a resist pattern as a mask to form a p$^+$ type semiconductor region 7 which serves as the other part of the source of the unit MIS1 and p$^+$ type semiconductor regions 16 and 17 which serve as the first and second p regions of the gate protective diode GD1. The p$^+$ type semiconductor region 7 which serves as the source of the unit MIS1 and the p$^+$ type semiconductor region 17 which serves as the second p region of the gate protective diode GD1 are coupled to the respective p$^+$ type buried layers 8 and electrically coupled to the substrate body 2a through the p$^+$ type buried layers 8. Thereafter, the substrate 2 is annealed by RTA or the like.

Figure 14B:
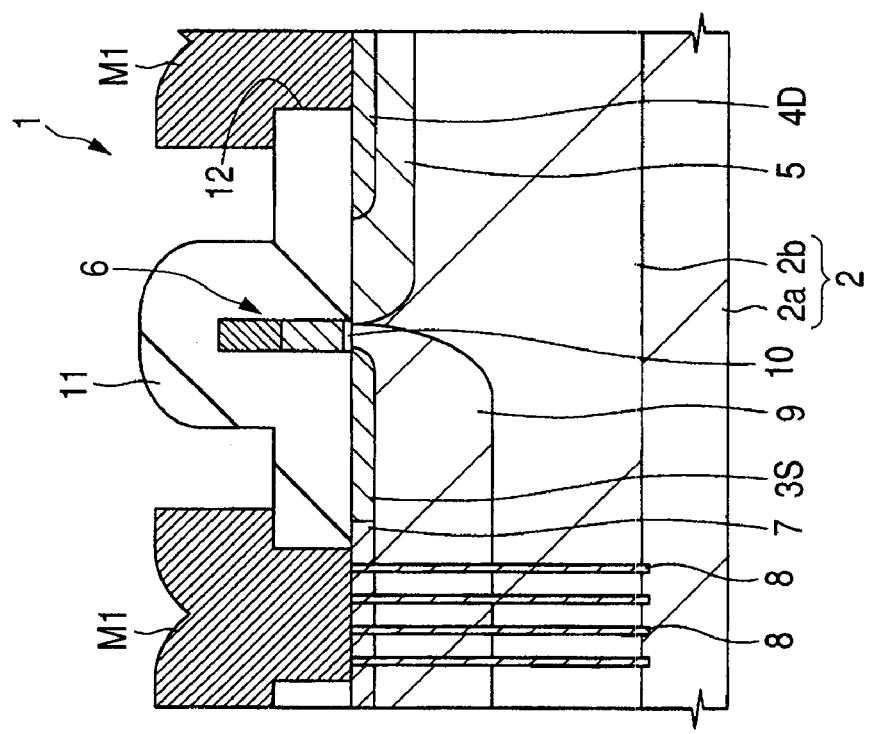
FIGS. 14A and 14B are sectional views of the key sections at the same locations as in FIGS. 11A and 11B in the course of manufacturing the gate protective circuit diode and the unit MIS configuring the high-frequency power MIS after FIGS. 12A and 12B.
Figure 14A:
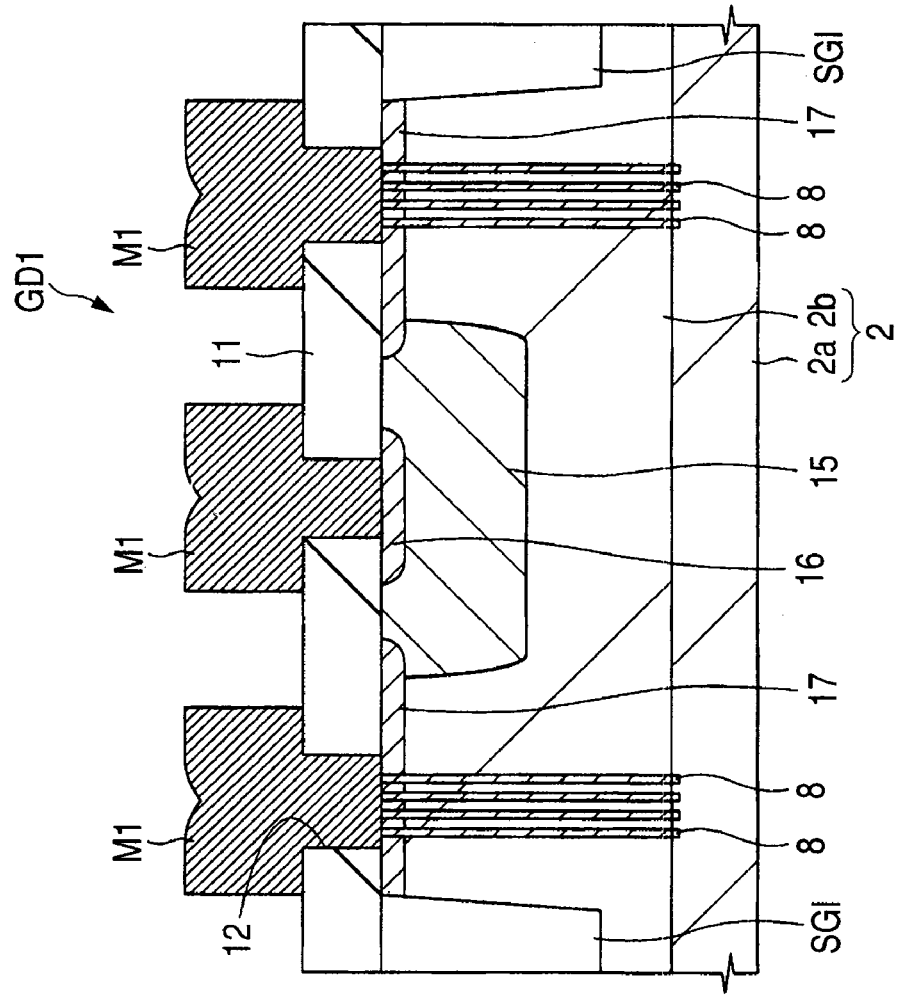

Then, as shown in FIGS. 14A and 14B, an insulating film 11 composed of a silicon oxide film is deposited over the main surface of the epitaxial layer 2b by CVD or the like. The thickness of the insulating film 11 is, for example, 0.3 to 0.5 µm. Subsequently, the insulating film 11 is patterned by photolithography and dry etching to form connection holes 12. The connection holes 12 reach the source region (p$^+$ type semiconductor region 7) and the drain region (n$^+$ type semiconductor region 4D) of the unit MIS1 and the first and second p regions (p$^+$ type semiconductor regions 16, 17) of the gate protective diode GD1.

Then, a metal film composed of an aluminum alloy film is deposited over the main surface of the epitaxial layer 2b by sputtering. The thickness of the metal film is, for example, 0.8 µm. Subsequently, the metal film is patterned by photolithography and dry etching to form the wirings M1 of the first layer. The wirings M1 of the first layer are coupled to the source region (p$^+$ type semiconductor region 7) and the drain region (n$^+$ type semiconductor region 4D) of the unit MIS1 and the first and second p regions (p$^+$ type semiconductor regions 16, 17) of the gate protective diode GD1 through the connection holes 12.

Then, as shown in FIGS. 15A and 15B, an insulating film 13 composed of a silicon oxide film is deposited over the main surface of the epitaxial layer 2b by CVD and patterned by photolithography and dry etching to form connection holes 14. The connection holes 14 reach, for example, the source region (p$^+$ type semiconductor region 7) and the drain region (n$^+$ type semiconductor region 4D) of the unit MIS1 and the wirings M1 of the first layer coupled to the first p region (p$^+$ type semiconductor region 16) of the gate protective diode GD1.

After a metal film composed of an aluminum alloy film is deposited over the main surface of the epitaxial layer 2b by sputtering, the metal film is patterned by photolithography and dry etching to form the unshown wirings of the second layer. The wirings of the second layer are coupled to the wirings M1 of the first layer coupled to the source region (p$^+$ type semiconductor region 7) and the drain region (n$^+$ type semiconductor region 4D) of the unit MIS1 and the first p region (p$^+$ type semiconductor region 16) of the gate protective diode GD1 through, for example, the connection holes 14. By the above steps, the gate protective circuit diode GD1 and the unit MIS1 constructing the high-frequency silicon power MIS shown in the above FIGS. 4 to 7 is substantially completed.

According to this Embodiment 1, since the end portions 8a of the p$^+$ type buried layers 8 are 7 µm or more separated from the n$^+$ type semiconductor region 15 configuring the n region, even when a defect is induced by stress produced in the end portions 8a of the p$^+$ type buried layers 8, and its influence upon the leak current of the gate protective diode GD1 becomes small, thereby making it possible to prevent an increase in the leak current of the gate protective diode GD1.

Embodiment 2

Although a high-output amplifier according to Embodiment 2 is the same as in the above-described Embodiment 1 and has high-frequency silicon power MIS's and gate protective diodes, the planar shape of the p$^+$ type buried layers formed in the gate protective diode differs from that of the p$^+$ type buried layers formed in the gate protective diode GD1 according to Embodiment 1. That is, in the above Embodiment 1, the p$^+$ type buried layers 8 in the gate protective diode GD1 have end portions 8a formed by cutting the p$^+$ type buried layers 8 at positions close to the four corners of the epitaxial layer 2b over which the gate protective diode GD1 is formed. In contrast to this, in the gate protective diode according to Embodiment 2, the p$^+$ type buried layers are formed continuously around the n$^+$ type semiconductor region configuring the n region.

Figure 16:
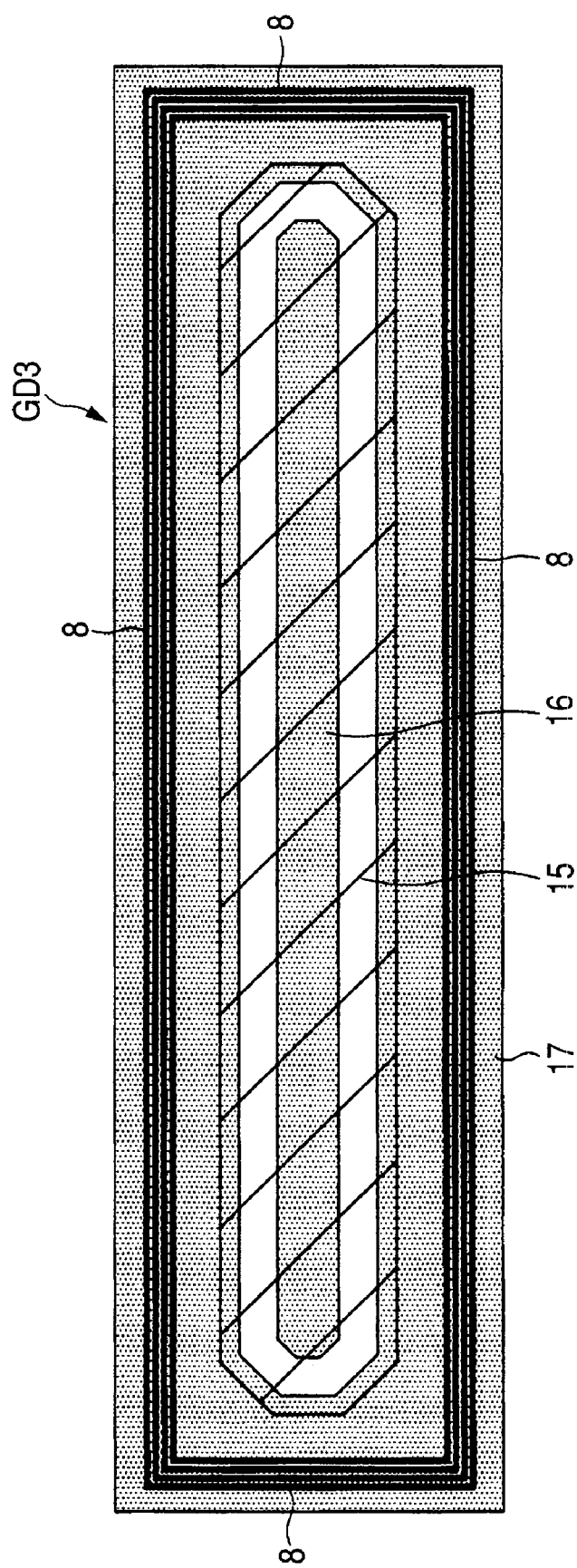
FIG. 16 is a plan view of the key section of a gate protective diode according to Embodiment 2.

FIG. 16 is a plan view of the key section of an example of the gate protective diode according to Embodiment 2.

The gate protective diode GD3 is formed over a rectangular epitaxial layer surrounded (defined) by a device separator and has two pn junctions constructed by p regions and an n region formed in the epitaxial layer. Since the structure of the gate protective diode GD3 is comprised of a first p region, an n region and a second p region like the above-described gate protective diode GD1 according to Embodiment 1, its description is omitted.

The p$^+$ type buried layers 8 are formed around the n$^+$ type semiconductor region 15 configuring the n region continuously and the end portions of the p$^+$ type buried layers 8 are not formed. Except for the four corners of the epitaxial layer over which the gate protective diode GD3 is formed, the p$^+$ type buried layers 8 are 3 μm separated from the n$^+$ type semiconductor region 15 configuring the n region.

The production of strong stress can be suppressed without providing end portions in the p$^+$ type buried layers 8. Even when stress is produced in the p$^+$ type buried layers 8 formed on both sides of the long sides of the n$^+$ type semiconductor region 15 configuring the n region, stress can be escaped into the p$^+$ type buried layers 8 formed on both sides of the short sides of the n$^+$ type semiconductor region 15 configuring the n region. Thereby, a defect which becomes the cause of the leak current of the gate protective diode GD3 is hardly induced, thereby making it possible to suppress an increase in the leak current of the gate protective diode GD3.

In the gate protective diode GD3 according to Embodiment 2, the planar shape of the n$^+$ type semiconductor region 15 configuring the n region is rectangular without four corners, for example, polygonal with 8 sides as in the above-described gate protective diode GD1 according to Embodiment 1. The planar shape is not limited to this and may be rectangular with four sides. That is, since the p$^+$ type buried layers 8 have no end portions, it is not necessary to form a portion where the distance between the p$^+$ type buried layers 8 and the n$^+$ type semiconductor region 15 configuring the n region is 7 μm or more. However, since a defect is more apt to be produced in the corners (coupling portions between the p$^+$ type buried layers 8 formed along the long sides of the n$^+$ type semiconductor region 15 configuring the n region and the p$^+$ type buried layers 8 formed along the short sides of the n$^+$ type semiconductor region 15 configuring the n region) of the p$^+$ type buried layers than in the other parts, it is desired that the planar shape of the n$^+$ type semiconductor region 15 configuring the n region should be rectangular without four corners and that the distance between the corners of the above p$^+$ type buried layers 8 and the n$^+$ type semiconductor region 15 configuring the n region should be 7 μm or more.

Figure 17:
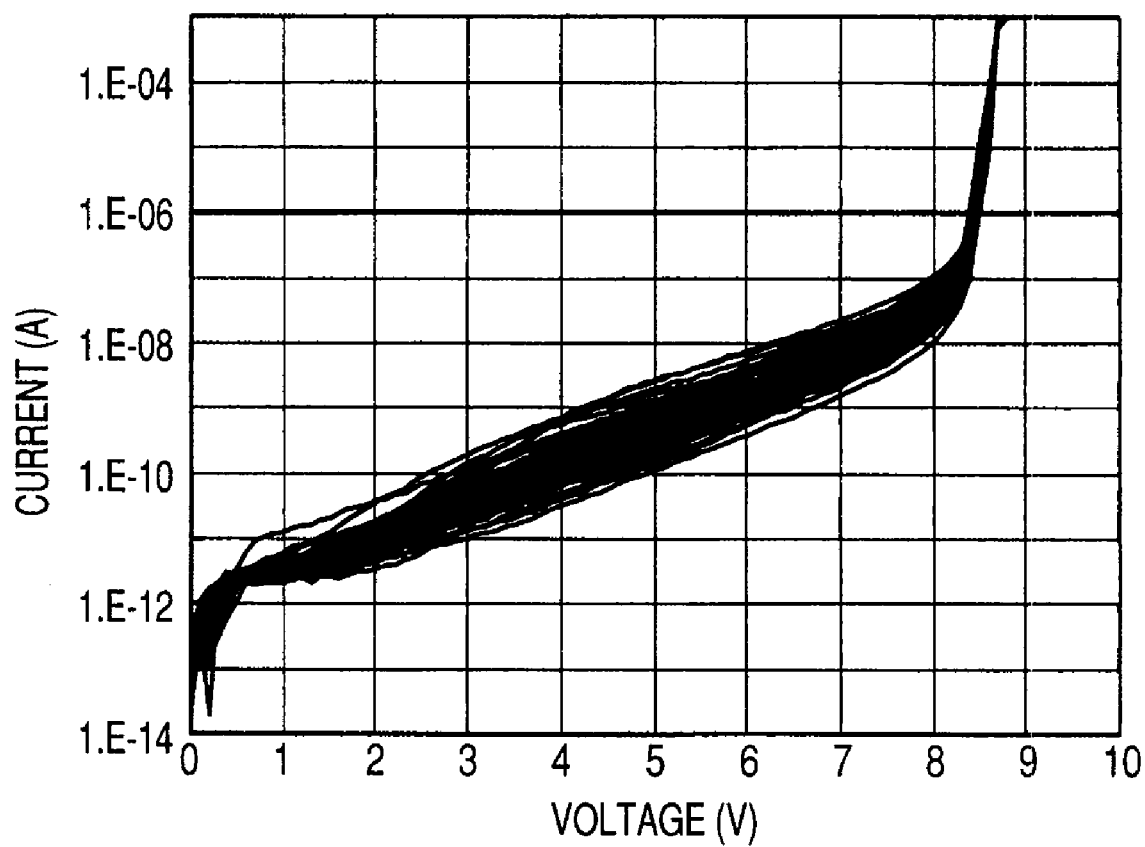
FIG. 17 is a graph showing the leak current characteristics of the gate protective diode according to Embodiment 2.

FIG. 17 is a graph showing the leak current characteristics of the gate protective diode GD3 according to Embodiment 2. As shown in FIG. 17, in the gate protective diode GD3 in which the p$^+$ type buried layers have no end portions, the gate withstand pressure regulated by a leak current of 1 μA is uniform and no failure is seen.

According to this Embodiment 2, since the p$^+$ type buried layers 8 are formed continuously around the n$^+$ type semiconductor region 15 configuring the n region, stress produced in the p$^+$ type buried layers 8 formed on both sides of the long sides of the n$^+$ type semiconductor region 15 configuring the n region can be escaped into the p$^+$ type buried layers 8 formed on both sides of the short sides of the n$^+$ type semiconductor region 15 configuring the n region, whereby a defect induced by stress produced by the p$^+$ type buried layers 8 is suppressed, and its influence upon the leak current of the gate protective diode GD3 becomes small, thereby making it possible to prevent an increase in the leak current of the gate protective diode GD3.

Embodiment 3

In a gate protective diode according to Embodiment 3, p$^+$ type buried layers are formed continuously around the n$^+$ type semiconductor region configuring the n region as in the above-described gate protective diode GD3 according to Embodiment 2. However, in the gate protective diode GD3 according to Embodiment 2, the distance between the short sides of the n$^+$ type semiconductor region 15 configuring the n region and the p$^+$ type buried layers formed along the short sides is the same as the distance between the long sides of the n$^+$ type semiconductor region 15 configuring the n region and the p$^+$ type buried layers 8 formed along the long sides. In contrast to this, in the gate protective diode according to this Embodiment 3, the distance between the short sides of the n$^+$ type semiconductor region configuring the n region and the p$^+$ type buried layers formed along the short sides is longer than the distance between the long sides of the n$^+$ type semiconductor region configuring the n region and the p$^+$ type buried layers formed along the long sides.

Figure 18:
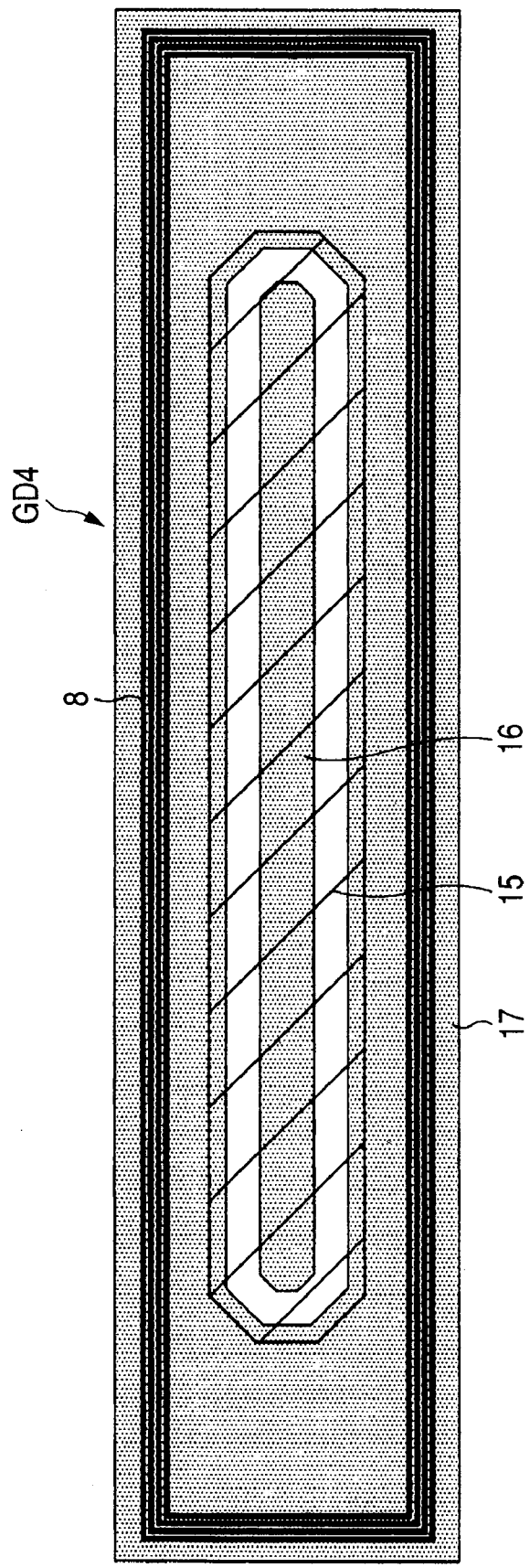
FIG. 18 is a plan view of the key section of a gate protective diode according to Embodiment 3.

FIG. 18 is a plan view of the key section of an example of the gate protective diode according to Embodiment 3.

The gate protective diode GD4 is formed over a rectangular epitaxial layer surrounded (defined) by a device separator and has two pn junctions constructed by p regions and an n region formed in the epitaxial layer. Since the structure of the gate protective diode GD4 is comprised of a first p region, an n region and a second p region like the above-described gate protective diode GD1 according to Embodiment 1, its description is omitted.

The p$^+$ type buried layers 8 are formed continuously around the n$^+$ type semiconductor region 15 configuring the n region and has no end portions. P$^+$ type buried layers 8 formed along the long sides of the n$^+$ type semiconductor region 15 configuring the n region are, for example, 3 μm separated from the n$^+$ type semiconductor region 15 configuring the n region. Further, the distance between p$^+$ type buried layers 8 formed along the short sides of the n$^+$ type semiconductor region 15 configuring the n region and the n$^+$ type semiconductor region 15 configuring the n region is longer than the distance between the p$^+$ type buried layers 8 formed along the long sides of the n$^+$ type semiconductor region 15 configuring the n region and the n$^+$ type semiconductor region 15 configuring the n region and is, for example, 15 μm. Therefore, the corners of the p$^+$ type buried layers 8 of the gate protective diode GD4 are farther from the n$^+$ type semiconductor region 15 configuring the n region than in the above-described gate protective diode GD3 according to Embodiment 2.

Since the p$^+$ type buried layers 8 have no end portions and the corners of the p$^+$ type buried layers 8 are positioned far away from the n$^+$ type semiconductor region 15 configuring the n region, even when a defect is induced by stress produced in the corner portions of the p$^+$ type buried layers 8 by the p$^+$ type buried layers 8 formed on both sides of the long sides of the n$^+$ type semiconductor region 15 configuring the n region, its influence upon the leak current of the gate protective diode GD4 becomes small, thereby making it possible to suppress an increase in the leak current of the gate protective diode GD4.

Figure 19:
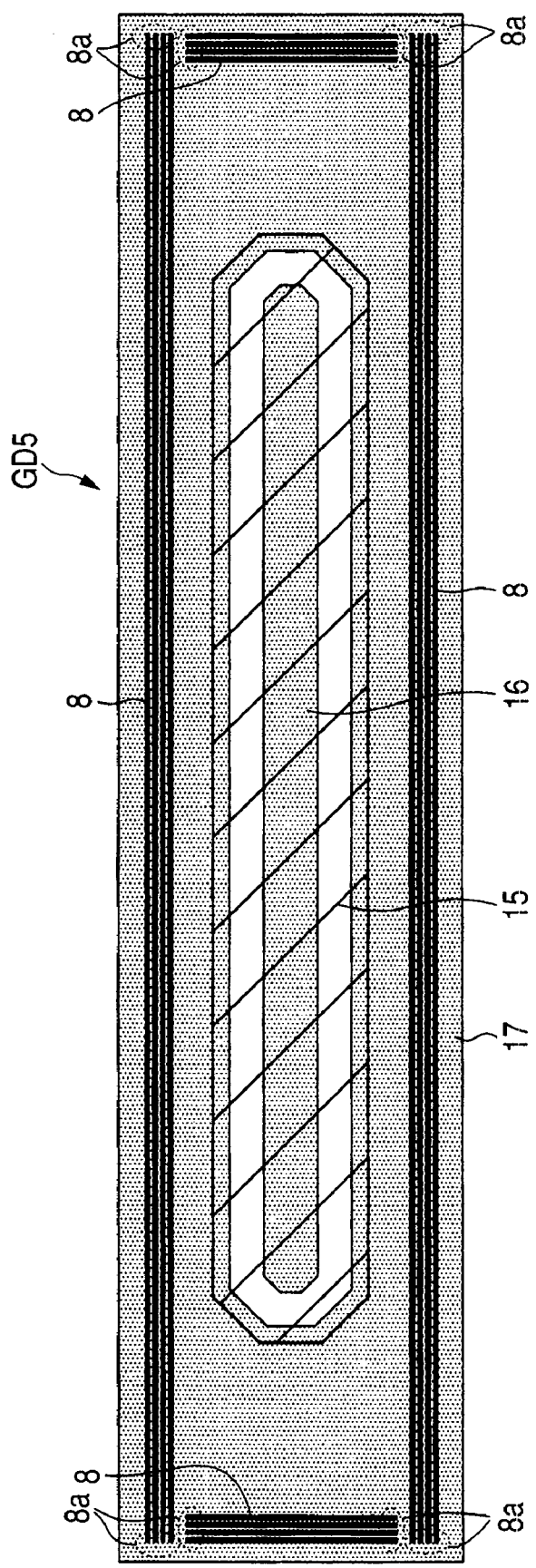
FIG. 19 is a plan view of the key section of a first modification of the gate protective diode according to Embodiment 3.
Figure 20:
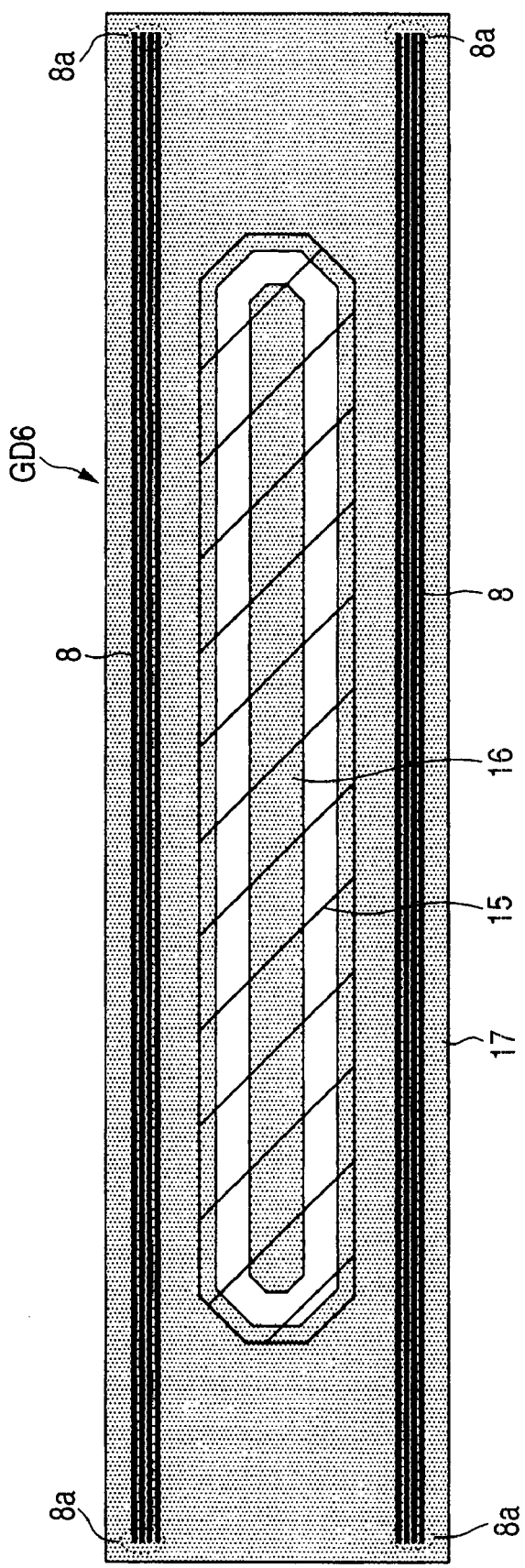
FIG. 20 is a plan view of the key section of a second modification of the gate protective diode according to Embodiment 3.

FIG. 19 and FIG. 20 show modifications of the gate protective diode provided in the high-frequency amplifier according to Embodiment 3. FIG. 19 is a plan view of the key section of a first modification of the gate protective diode GD4 and FIG. 20 is a plan view of the key section of a second modification of the gate protective diode GD4.

In the gate protective diode GD5 which is the first modification, as shown in FIG. 19, the p$^+$ type buried layers 8 are cut at positions close to the four corners of the epitaxial layer over which the gate protective diode GD5 is formed to have end portions 8a. However, as compared with the above-described gate protective diode GD1 according to Embodiment 1, the end portions 8a of the p$^+$ type buried layers 8 are farther, for example, 15 μm away from the n$^+$ type semiconductor region 15 configuring the n region. Therefore, even when stress is produced in the end portions 8a of the p$^+$ type buried layers 8, the influence of a defect which becomes the cause of the leak current of the gate protective diode GD5 becomes small.

In the gate protective diode GD6 which is the second modification, as shown in FIG. 20, the p$^+$ type buried layers 8 are not formed on both sides of the short sides of the n$^+$ type semiconductor region 15 configuring the n region, and the p$^+$ type semiconductor region 17 and the substrate body 2a are electrically coupled to each other only by the p$^+$ type buried layers 8 formed on both sides of the long sides of the n$^+$ type semiconductor region 15 configuring the n region. As compared with, for example, the above-described gate protective diode GD1 according to Embodiment 1, the end portions 8a of the p$^+$ type buried layers 8 are far away from the n$^+$ type semiconductor region 15 configuring the n region, whereby the influence of a defect which becomes the cause of the leak current of the gate protective diode GD6 becomes small.

According to this Embodiment 3, the corners (or the end portions 8a) of the p$^+$ type buried layers 8 can be farther away from the n$^+$ type semiconductor region 15 configuring the n region than in the above-described gate protective diode GD1 according to Embodiment 1 or the above-described gate protective diode GD3 according to Embodiment 2. Therefore, the influence of a defect induced by stress produced in the corners (or the end portions 8a) of the p$^+$ type buried layers 8 upon the leak current of the gate protective diode GD4 (or GD5 or GD6) becomes small, thereby making it possible to suppress an increase in the leak current of the gate protective diode GD4 (or GD5 or GD6).

Embodiment 4

Although the high-frequency amplifier according to Embodiment 4 is identical to that of the above Embodiment 1 and has high-frequency silicon power MIS's and gate protective diodes, the planar shape of p$^+$ type buried layers formed in the gate protective diode differs from that of the p$^+$ type buried layers formed in the above-described gate protective diode GD1 according to Embodiment 1. That is, in the gate protective diode according to Embodiment 4, the p$^+$ type buried layers formed on both sides of the long sides of the n$^+$ type semiconductor region configuring the n region are divided into a plurality of sections.

Figure 21:
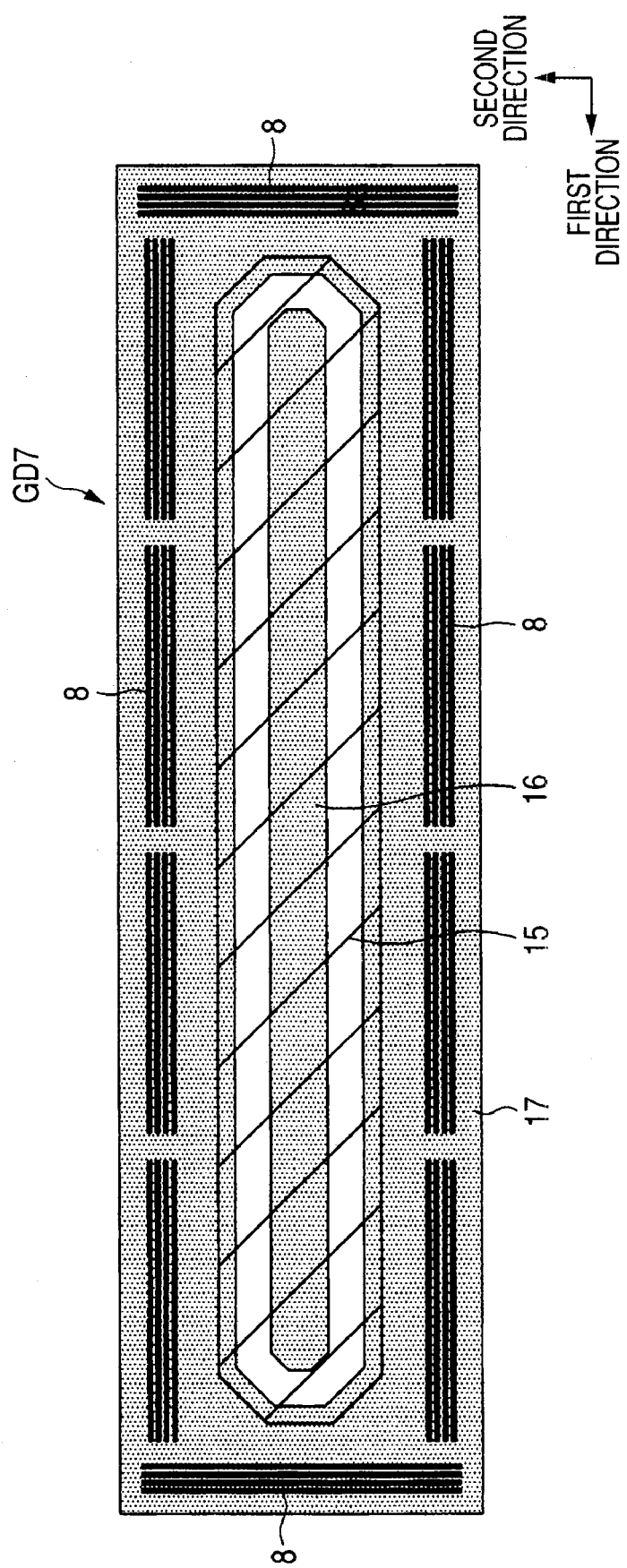
FIG. 21 is a plan view of the key section of a gate protective diode according to Embodiment 4.

FIG. 21 is a plan view of the key section of an example of the gate protective diode according to Embodiment 4.

The gate protective diode GD7 is formed over a rectangular epitaxial layer surrounded (defined) by a device separator and has 2 pn junctions constructed by p regions and an n region formed in the epitaxial layer. Since the structure of the gate protective diode GD7 is comprised of a first p region, an n region and a second p region like the above-described gate protective diode GD1 according to Embodiment 1, its description is omitted.

The p$^+$ type buried layers 8 are formed on both sides of the long sides in the first direction of the n$^+$ type semiconductor region 15 configuring the n region and on both sides of the short sides in the second direction. That is, the p$^+$ type buried layers 8 are formed in the peripheral portion of the epitaxial layer over which the gate protective diode GD7 is formed and cut at positions close to the four corners of the epitaxial layer. Further, the p$^+$ type buried layers 8 formed on both sides of the long sides of the n$^+$ type semiconductor region 15 configuring the n region are divided into 4 sections. The length of each section of the p$^+$ type buried layers 8 is, for example, 20 μm or less. The distance between the end portions 8a of the divided p$^+$ type buried layers 8 and the n$^+$ type semiconductor region 15 configuring the n region is, for example, 3 μm.

By reducing the length of each section of the p$^+$ type buried layers 8 to 20 μm or less, stress in the end portions 8a of the divided p$^+$ type buried layers 8 can be reduced. Therefore, even when the distance between the end portions 8a of the divided p$^+$ type buried layers 8 and the n$^+$ type semiconductor region 15 configuring the n region is set to 3 μm, a defect which becomes the cause of the leak current of the gate protective diode GD7 is hardly induced, thereby making it possible to prevent an increase in the leak current of the gate protective diode GD7.

In the gate protective diode GD7 according to Embodiment 4, the planar shape of the n$^+$ type semiconductor region 15 configuring the n region is rectangular without four corners, for example, polygonal with 8 sides like the above-described gate protective diode GD1 according to Embodiment 1. The planar shape is not limited to this and may be rectangular with 4 sides. That is, it is not necessary to form a portion where the distance between the end portions 8a of the divided p$^+$ type buried layers 8 and the n$^+$ type semiconductor region 15 configuring the n region must be 7 μm or more, and the distance between the end portions 8a of the p$^+$ type buried layers 8 and the n$^+$ type semiconductor region 15 configuring the n region must be 3 μm or more.

Figure 22:
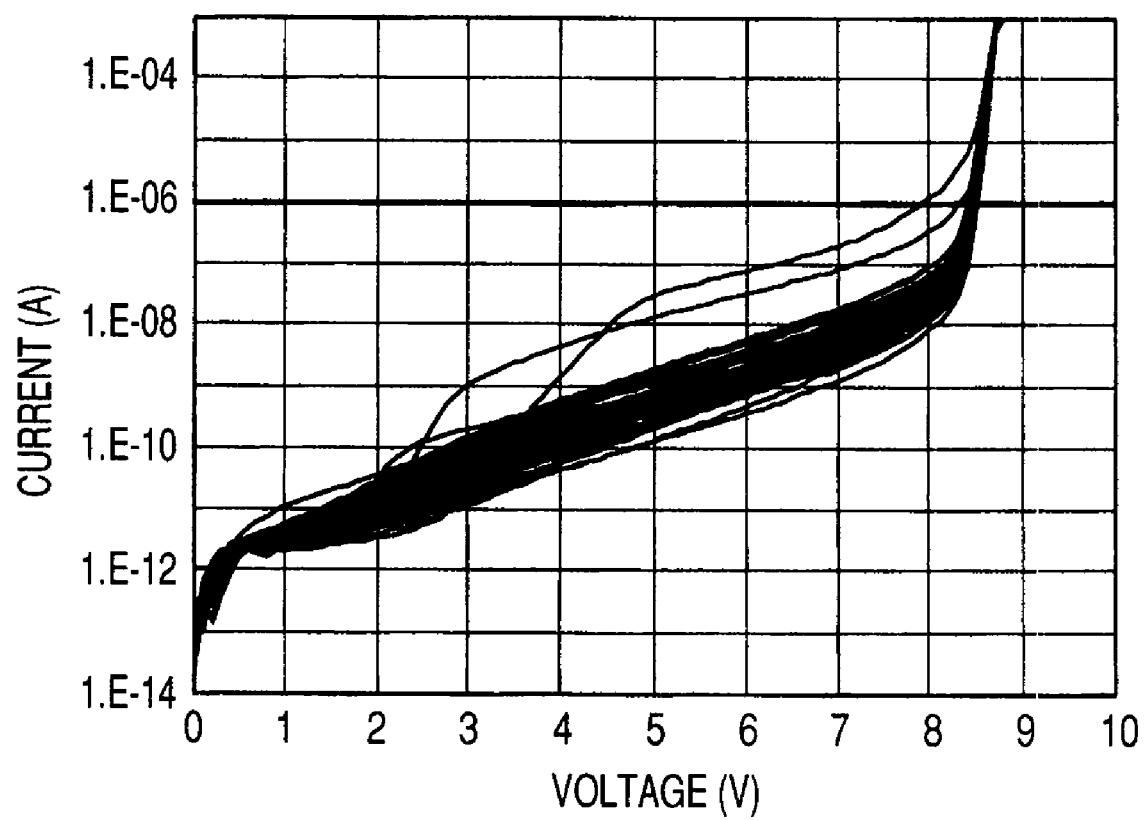
FIG. 22 is a graph showing the leak current characteristics of the gate protective diode according to Embodiment 4.

FIG. 22 is a graph showing the leak current characteristics of the gate protective diode GD7 according to Embodiment 4. As shown in FIG. 22, by setting the length of each section of the p$^+$ type buried layers to 20 μm or less, although the gate withstand pressure is slightly reduced in the gate protective diode GD7, the gate withstand pressure regulated by a leak current of 1 μA is uniform and almost the same level as that of the above-described gate protective diode GD1 according to Embodiment 1.

According to this Embodiment 4, since the p$^+$ type buried layers 8 formed on both sides of the long sides of the n$^+$ type semiconductor region 15 configuring the n region are divided into sections having a length of 20 μm or less, stress produced in the end portions 8a of the p$^+$ type buried layers 8 becomes small. Therefore, a defect induced thereby is suppressed, and the influence of the defect upon the leak current of the gate protective diode GD7 becomes small, thereby making it possible to prevent an increase in the leak current of the gate protective diode GD7.

Having described the invention made by the inventors of the invention based on its embodiments above, it is needless to say that the invention is not limited by the above embodiments and that changes and variations may be made without departing from the spirit or scope of the invention.

For example, in the above embodiments, the planar shape of the gate protective diode is rectangular but may be square, polygonal or circular.

The semiconductor device of the present invention can be used in an RF module for mobile phones which incorporates a high-frequency power amplifier including high-frequency silicon power MIS's and gate protective diodes.

What is claimed is:

1. A semiconductor device having a diode over a substrate comprising a substrate body of a first conductive type and a semiconductor layer of the first conductive type formed over the top of the substrate body,
wherein the diode comprises a first region of a second conductive type formed over the main surface of the semiconductor layer surrounded by a device separator, a second region of the first conductive type formed at the center of the main surface of the first region, a third region of the first conductive type formed over the main surface of the semiconductor layer surrounding the first region from the periphery of the main surface of the first region, and buried layers of the first conductive type which are buried in grooves formed in the semiconductor layer and couple the third region to the substrate body, and
wherein the buried layers are formed around the first region and have end portions formed by cutting on the planar shape, and the distance between the end portions of the buried layers and the first region is larger than the distance between portions other than the end portions of the buried layers and the first region.

2. The semiconductor device according to claim 1, wherein the end portions of the buried layers are 7 μm or more away from the first region.

3. The semiconductor device according to claim 1, wherein the impurity concentration of the substrate body is $1 \times 10^{19}$ to $1 \times 10^{20}$ cm$^{-3}$.

4. The semiconductor device according to claim 1, wherein the resistivity of the substrate body is less than 3 mΩcm.

5. The semiconductor device according to claim 1, wherein the semiconductor layer surrounded by the device separator has a rectangular, square, polygonal or circular planar shape.

6. The semiconductor device according to claim 1, wherein the planar shape of the semiconductor layer surrounded by the device separator is rectangular, and the buried layers have the end portions on both sides of the long sides of the first region along the long sides of the semiconductor layer surrounded by the device separator and the end portions on both sides of the short sides of the first region along the short sides of the semiconductor layer surrounded by the device separator.

7. The semiconductor device according to claim 6, wherein the planar shape of the first region is rectangular without four corners.

8. The semiconductor device according to claim 6, wherein the length of each of the buried layers along the long sides of the semiconductor layer is larger than the length of the first region along the long sides of the semiconductor layer.

9. The semiconductor device according to claim 6, wherein the length of each of the buried layers along the short sides of the semiconductor layer is larger than the length of the first region along the short sides of the semiconductor layer.

10. The semiconductor device according to claim 1, wherein the planar shape of the semiconductor layer surrounded by the device separator is rectangular, and the buried layers have end portions only on both sides of the long sides of the first region along the long sides of the semiconductor layer surrounded by the device separator.

11. The semiconductor device according to claim 1, wherein the substrate further has a field effect transistor and the second region is electrically coupled to the gate of the field effect transistor.

* * * * *